US009820373B2

(12) United States Patent
Pennathur et al.

(10) Patent No.: US 9,820,373 B2
(45) Date of Patent: Nov. 14, 2017

(54) THERMAL SOLUTIONS FOR SYSTEM-IN-PACKAGE ASSEMBLIES IN PORTABLE ELECTRONIC DEVICES

(71) Applicant: Apple Inc., Cupertino, CA (US)

(72) Inventors: Shankar S. Pennathur, San Jose, CA (US); Carlos A. S. Ribas, Los Altos, CA (US); Deniz Teoman, San Mateo, CA (US); Michael Eng, San Jose, CA (US)

(73) Assignee: Apple Inc., Cupertino, CA (US)

( * ) Notice: Subject to any disclaimer, the term of this patent is extended or adjusted under 35 U.S.C. 154(b) by 147 days.

(21) Appl. No.: 14/503,067

(22) Filed: Sep. 30, 2014

(65) Prior Publication Data

US 2015/0382448 A1 Dec. 31, 2015

Related U.S. Application Data

(60) Provisional application No. 62/017,630, filed on Jun. 26, 2014.

(51) Int. Cl.
*H01L 23/552* (2006.01)
*H01L 23/31* (2006.01)
(Continued)

(52) U.S. Cl.
CPC ............ *H05K 1/0212* (2013.01); *G06F 1/20* (2013.01); *H01L 23/3128* (2013.01);
(Continued)

(58) Field of Classification Search
CPC ... H01L 23/552; H01L 23/3128; H01L 23/36; H01L 23/4334; H01L 23/481;
(Continued)

(56) References Cited

U.S. PATENT DOCUMENTS 5,461,545 A 10/1995 Leroy et al.
5,483,261 A 1/1996 Yasutake
(Continued)

FOREIGN PATENT DOCUMENTS

CN 102054821 A 5/2011
EP 0 130 279 A2 1/1985
(Continued)

OTHER PUBLICATIONS

ROC (Taiwan) Search Report mailed Dec. 15, 2015, for TW Application No. 104102913, one page.
(Continued)

*Primary Examiner* — Adam B Dravininkas
(74) *Attorney, Agent, or Firm* — Morrison & Foerster LLP

(57) ABSTRACT

A compact portable electronic device packaged into a System-in-Package assembly and thermal solutions for the device is disclosed. The compact portable electronic device can be assembled into a single package to reduce size and enhance form factor. Several tens or hundreds of components including multiple dies, passive components, mechanical or optical components can be packaged into a single system on a printed circuit board. One or more of the components can dissipate a lot of power resulting in the generation of excess heat. To remove the excess heat, the device can include one or more thermal solutions such as internal thermal plugs, heat spreaders, internal embedded heat sinks, and/or external heat sinks. In some examples, the thermal solutions can dissipate heat via conduction to the bottom of the substrate or via convection to the top of the system or a combination of both.

10 Claims, 18 Drawing Sheets

(51) Int. Cl.
- *H05K 7/20* (2006.01)
- *H05K 1/02* (2006.01)
- *H05K 3/28* (2006.01)
- *H05K 3/30* (2006.01)
- *G06F 1/20* (2006.01)
- *H01L 23/36* (2006.01)
- *H01L 23/433* (2006.01)
- *H01L 23/34* (2006.01)

(52) U.S. Cl.
CPC ............ *H01L 23/34* (2013.01); *H01L 23/36* (2013.01); *H01L 23/4334* (2013.01); *H01L 23/552* (2013.01); *H05K 1/023* (2013.01); *H05K 1/0203* (2013.01); *H05K 3/284* (2013.01); *H05K 3/303* (2013.01); *H01L 23/3121* (2013.01); *H01L 2924/0002* (2013.01)

(58) Field of Classification Search
CPC .......... H01L 23/3135; H01L 23/49827; G06F 1/1626; G06F 1/203; G06F 1/20; H05K 7/20409; H05K 7/20418
USPC .............. 361/679.54, 704, 707, 709–715
See application file for complete search history.

(56) References Cited

U.S. PATENT DOCUMENTS

| | | | |
|---|---|---|---|
| 5,488,204 A | 1/1996 | Mead et al. | |
| 5,639,989 A * | 6/1997 | Higgins, III | H01L 23/552 174/386 |
| 5,825,352 A | 10/1998 | Bisset et al. | |
| 5,835,079 A | 11/1998 | Shieh | |
| 5,880,411 A | 3/1999 | Gillespie et al. | |
| 6,188,391 B1 | 2/2001 | Seely et al. | |
| 6,310,610 B1 | 10/2001 | Beaton et al. | |
| 6,323,846 B1 | 11/2001 | Westerman et al. | |
| 6,625,026 B1 | 9/2003 | Boudreaux et al. | |
| 6,690,387 B2 | 2/2004 | Zimmerman et al. | |
| 6,858,930 B2 | 2/2005 | Miller et al. | |
| 7,015,894 B2 | 3/2006 | Morohoshi | |
| 7,184,064 B2 | 2/2007 | Zimmerman et al. | |
| 7,187,060 B2 | 3/2007 | Usui | |
| 7,663,607 B2 | 2/2010 | Hotelling et al. | |
| 7,808,781 B2 | 10/2010 | Colgan et al. | |
| 8,212,340 B2 | 7/2012 | Liao | |
| 8,304,289 B2 | 11/2012 | Usui et al. | |
| 8,373,256 B2 | 2/2013 | Kaneko et al. | |
| 8,479,122 B2 | 7/2013 | Hotelling et al. | |
| 8,536,713 B2 | 9/2013 | Teig | |
| 2002/0034066 A1 | 3/2002 | Huang et al. | |
| 2003/0155987 A1 | 8/2003 | Kolb et al. | |
| 2004/0194988 A1 | 10/2004 | Chen | |
| 2005/0167849 A1* | 8/2005 | Sato | H01L 23/3121 257/778 |
| 2006/0131735 A1 | 6/2006 | Ong et al. | |
| 2006/0197753 A1 | 9/2006 | Hotelling | |
| 2008/0211088 A1 | 9/2008 | Sato | |
| 2009/0000114 A1* | 1/2009 | Rao | H01L 23/552 29/832 |
| 2009/0079041 A1 | 3/2009 | Huang et al. | |
| 2009/0115037 A1 | 5/2009 | How et al. | |
| 2009/0127700 A1* | 5/2009 | Romig | H01L 21/563 257/712 |
| 2010/0207257 A1 | 8/2010 | Lee | |
| 2010/0285636 A1 | 11/2010 | Chen | |
| 2010/0319981 A1 | 12/2010 | Kapusta et al. | |
| 2011/0005662 A1 | 1/2011 | Sung | |
| 2011/0162828 A1* | 7/2011 | Kirk | H01L 23/367 165/185 |
| 2012/0044653 A1 | 2/2012 | Morris | |
| 2012/0243191 A1 | 9/2012 | Wu | |
| 2015/0271911 A1 | 9/2015 | Chen et al. | |
| 2015/0271959 A1 | 9/2015 | Chen et al. | |

FOREIGN PATENT DOCUMENTS

| | | |
|---|---|---|
| EP | 0 777 274 A1 | 6/1997 |
| EP | 2 669 942 A2 | 12/2013 |
| EP | 2 713 683 A1 | 4/2014 |
| JP | 2000-163031 A | 6/2000 |
| JP | 2002-342033 A | 11/2002 |
| JP | 2005-109306 A | 4/2005 |
| JP | 2009-301830 A | 12/2009 |
| KR | 10-1200051 B1 | 11/2012 |
| TW | 200420218 | 10/2004 |
| WO | WO-2013/104274 A1 | 1/2013 |
| WO | WO-2013/066751 A1 | 5/2013 |
| WO | WO-2015/142426 A1 | 9/2015 |
| WO | WO-2015/142427 A1 | 9/2015 |
| WO | WO-2015/199810 A1 | 12/2015 |

OTHER PUBLICATIONS

International Search Report dated Apr. 21, 2015, for PCT Application No. PCT/US2015/013610, filed Jan. 29, 2015, four pages.
International Search Report dated Apr. 21, 2015, for PCT Application No. PCT/US2015/013615, filed Jan. 29, 2015, four pages.
ROC (Taiwan) Search Report dated Apr. 12, 2016, for TW Application No. 104103062, with English translation, two pages.
Lee, S.K. et al. (Apr. 1985). "A Multi-Touch Three Dimensional Touch-Sensitive Tablet," *Proceedings of CHI: ACM Conference on Human Factors in Computing Systems*, pp. 21-25.
Rubine, D.H. (Dec. 1991). "The Automatic Recognition of Gestures," CMU-CS-91-202, Submitted in Partial Fulfillment of the Requirements for the Degree of Doctor of Philosophy in Computer Science at Carnegie Mellon University, 285 pages.
Rubine, D.H. (May 1992). "Combining Gestures and Direct Manipulation," CHI ' 92, pp. 659-660.
Westerman, W. (Spring 1999). "Hand Tracking, Finger Identification, and Chordic Manipulation on a Multi-Touch Surface," A Dissertation Submitted to the Faculty of the University of Delaware in Partial Fulfillment of the Requirements for the Degree of Doctor of Philosophy in Electrical Engineering, 364 pages.
International Search Report dated Nov. 23, 2015, for PCT Application No. PCT/US2015/028654, filed Apr. 30, 2015, nine pages.
Non-Final Office Action dated Sep. 13, 2016, for U.S. Appl. No. 14/308,463, filed Jun. 18, 2014, 14 pages.
Non-Final Office Action dated Nov. 2, 2016, for U.S. Appl. No. 14/308,386, filed Jun. 18, 2014, 15 pages.

* cited by examiner

THERMAL SOLUTIONS FOR SYSTEM-IN-PACKAGE ASSEMBLIES IN PORTABLE ELECTRONIC DEVICES

FIELD

This relates generally to dissipating thermal heat and, more particularly, to effective thermal solutions for components in System-In-Package assemblies in compact portable electronic devices.

BACKGROUND

Compact portable electronic devices are becoming increasingly popular. Examples of compact portable electronic devices include laptop computers, tablet computing devices, cellular telephones, media players, gaming devices, handheld devices, miniature devices such as pendant and wristwatch devices, and other devices. It is generally desirable to reduce the size and enhance the form factor of compact portable electronic devices. One way to reduce size and enhance form factor is to integrate circuitry into a System-in-Package assembly. In a System-in-Package assembly, hundreds of electrical components including multiple dies, passive components, mechanical or optical components can be packaged in a single system on a printed circuit board.

One or more of the components in the System-in-Package assembly can dissipate a lot of power. This power dissipation can result in the generation of heat. With advances in computing speed and complexity, the issue can be further compounded. Without an effective thermal solution, excess heat can lead to performance degradation and decreased long-term reliability of the components.

SUMMARY

This relates to a compact portable electronic device and thermal solutions for the device packaged into a System-in-Package assembly. The compact portable electronic device can be assembled into a single package to reduce size and enhance form factor. Several tens or hundreds of components including multiple dies, passive components, mechanical or optical components can be packaged into a single system on a printed circuit board. One or more of the components can dissipate a lot of power resulting in the generation of excess heat. To remove the excess heat, the device can include one or more thermal solutions such as internal thermal plugs, heat spreaders, internal embedded heat sinks, and/or external heat sinks.

DETAILED DESCRIPTION

Figure 1A:
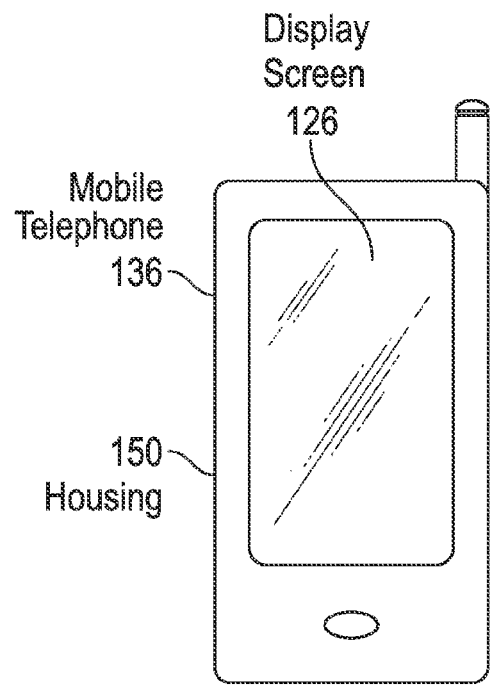
FIGS. 1A-1D illustrate systems in which examples of the disclosure can be implemented.

In the following description of examples, reference is made to the accompanying drawings in which it is shown by way of illustration specific examples that can be practiced. It is to be understood that other examples can be used and structural changes can be made without departing from the scope of the various examples.

This relates to thermal solutions for electrical, mechanical, and optical components and subsystems in a portable electronic device assembled using System-in-Package (SiP) technology. Thermal solutions can include, but are not limited to, thermal plugs, heat spreaders, internal embedded heat sinks, and external heat sinks. The thermal solutions can allow heat generated internally by "hot" components to be conducted or dissipated out. Hot components can include transceivers, memory circuits, and other circuitry formed from one or more discrete components such as transistors, amplifiers, inductors, capacitors, resistors, switches, etc. The thermal solutions can dissipate heat via conduction to the bottom of the substrate or via convection to the top of the system or a combination of both.

In recent years, portable electronic devices such as laptops, tablet computing devices, cellular telephones, media players, gaming devices, handheld devices, miniature devices, etc., have become small, light and powerful. One factor contributing to this reduction in size can be attributed to the manufacturer's ability to fabricate various components in these devices in smaller and smaller sizes while, in some cases, increasing the power and/or operating speed of such components. Another factor contributing to the reduction in size is that from a visual standpoint, users often find compact and sleek designs of portable electronic devices more aesthetically appealing and thus, demand compact and sleek designs. The trend for smaller, lighter, more compact and powerful devices presents continuing challenges in the design of portable electronic devices and its associated components.

One area that can enable small and compact devices is internal packaging. A particular device can have a desired form factor and functionality. The desired form factor can determine a size of the housing in which components that provide the desired functionality are packaged into. The internal packaging design can involve minimizing any unused dead space that does not contribute in some way to the functioning of the device while still fitting the needed components in an allotted space dictated by the form factor.

Electrical, mechanical, and optical components can be included in one or more subsystems and packaged using the System-in-Package (SiP) technology. SiP is a functional system assembled into a single package. Several tens or hundreds of components including multiple dies, passive components, mechanical or optical components can be packaged in a single system on a printed circuit board (PCB). The PCB can be formed from rigid PCB materials such as fiberglass-filled epoxy (e.g., FR4), flexible printed circuits (e.g., printed circuits formed from flexible sheets of polymer such as polyimide), and rigid flex circuits (e.g., printed circuits that contain both rigid portions and flexible tails). PCBs on which components such as integrated circuit components and discrete components are mounted can sometimes be referred to as main logic boards (MLBs). The components can be mounted on the PCB using solder or other suitable mounting arrangements. For example, the components can be surface-mount technology (SMT) components that are mounted directly onto a PCB. SiP can lead to higher volumetric efficiency, superior reliability, higher performance, and smaller form factor.

Figure 1B:
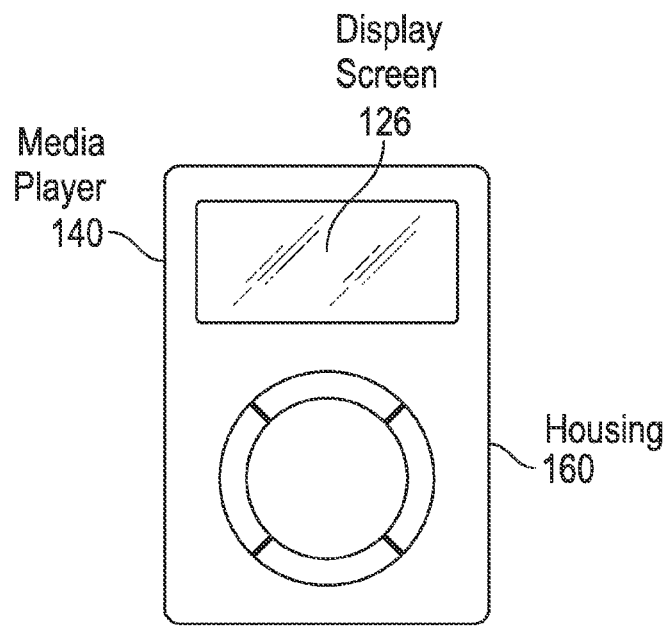
Figure 1C:
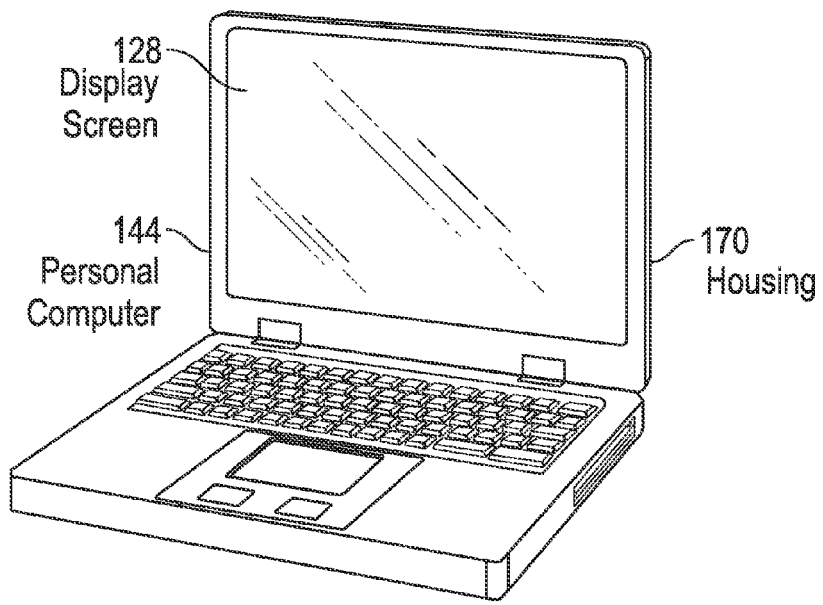
Figure 1D:
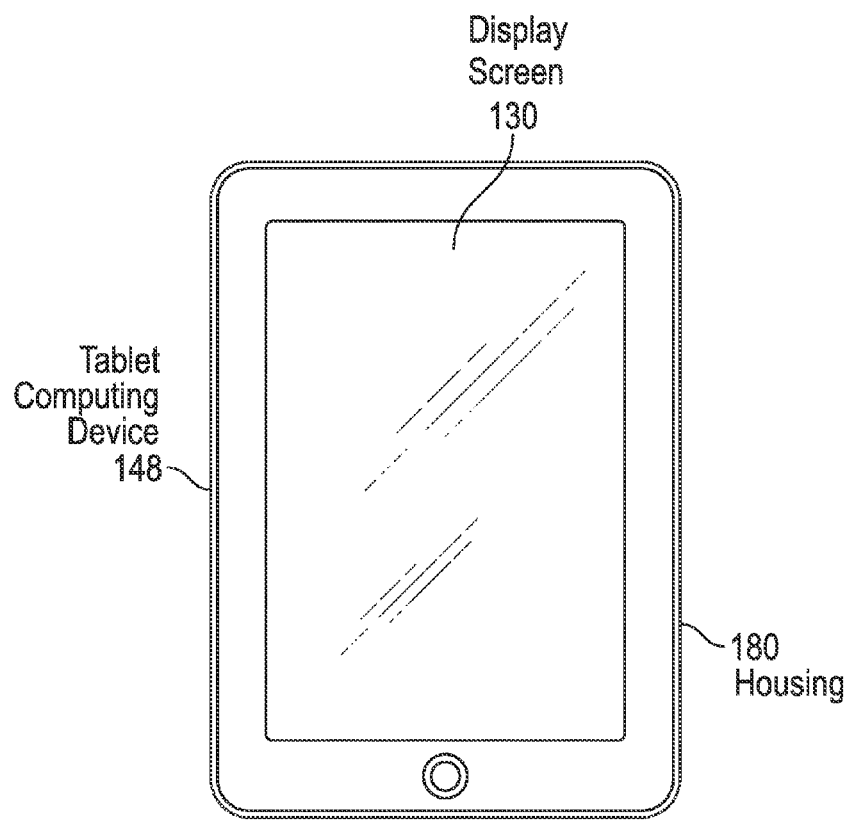

FIGS. 1A-1D illustrate systems in which examples of the disclosure can be implemented. FIG. 1A illustrates an exemplary mobile telephone 136 that includes a display screen 124 packaged in housing 150. FIG. 1B illustrates an exemplary digital media player 140 that includes a display screen 126 packaged in housing 160. FIG. 1C illustrates an exemplary personal computer 144 that includes a display screen 128 packaged in housing 170. FIG. 1D illustrates an exemplary tablet computing device 148 that includes a display screen 130 packaged in housing 180. The one or more thermal solutions according to the disclosure can be implemented in one or more of the illustrated systems.

Figure 2A:
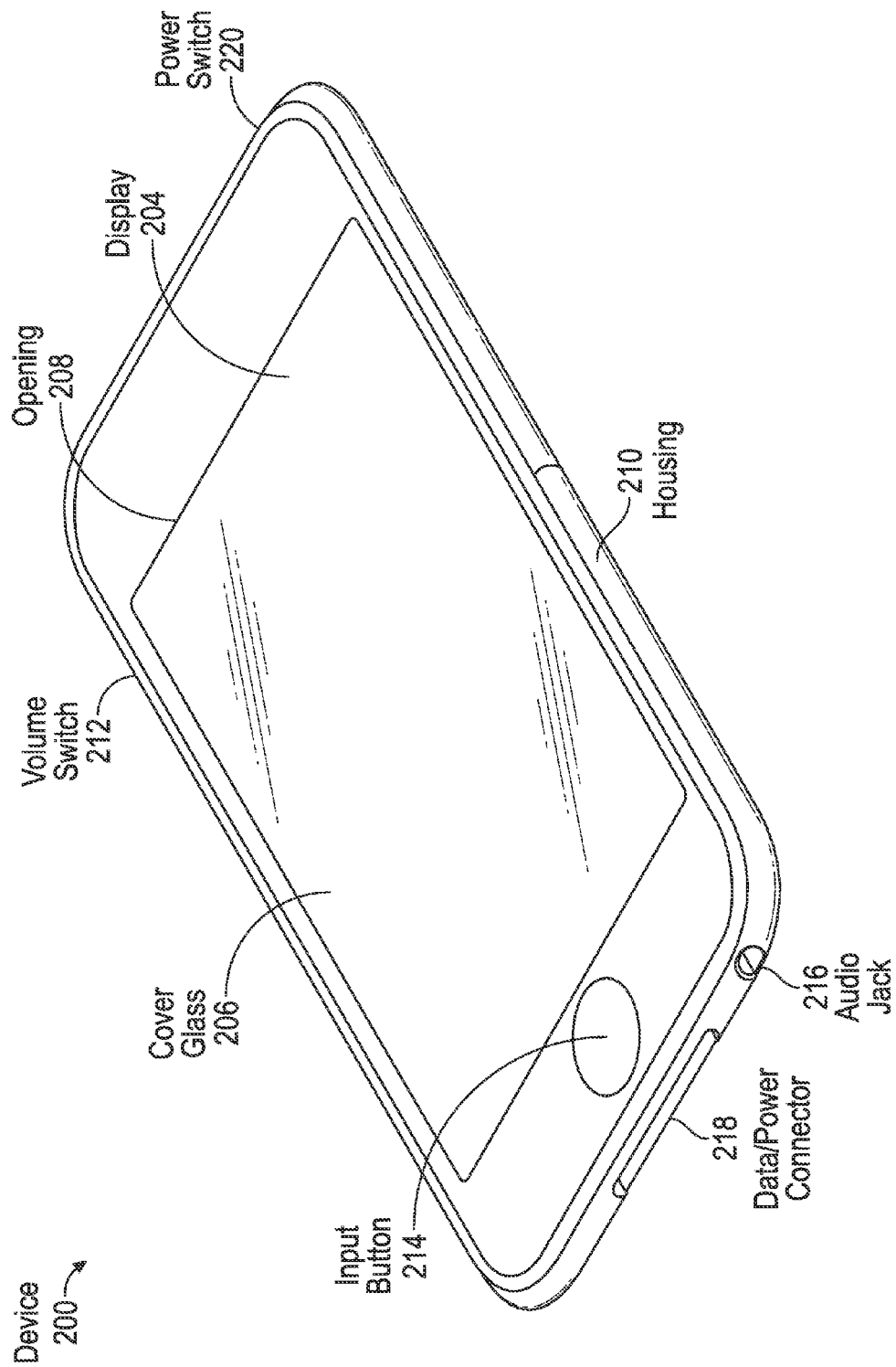
FIG. 2A illustrates a perspective view of an exemplary portable electronic device.

FIG. 2A illustrates a perspective view of an exemplary portable electronic device. Device 200 can include a housing 210 with an opening 208. A display 204 surrounded by a frame can be positioned within opening 208. Display circuitry for the display 204 can be located within housing 210, such as directly below display 204. The positioning of the display circuitry can affect the internal spaces that are available within housing 210.

A touch screen can be associated with display 204. Circuitry associated with the touch screen, such as a touch screen controller, can be located within housing 210. Housing 210 can be formed from any material such as metal, plastic, fiber-composite materials, carbon fiber materials, glass, ceramics, or combinations of these materials. Housing 210 can be formed from a single piece of machined metal (e.g., using a unibody-type construction) or can be formed from multiple structures that are attached together such as an internal housing frame, a bezel or band structure, housing sidewalls, planar housing wall members, etc. Display 204 can be sealed via a cover glass or cover material 206. One or more input buttons, such as input button 214, can be positioned in an opening of cover glass 206. Detection circuitry associated with input button 214 can be located within housing 210. In some examples, input button 214 can be used to return device 200 to a particular state, such as a home state.

A number of input/output mechanisms can be located around the edges of housing 210. For instance, a data/power connector 218 and audio jack 216 can be located on a bottom edge of housing 210, and a power switch 220 can be located on a top edge of housing 210. Housing 210 can also include openings for speakers and/or microphones. Circuitry supporting these components can be packaged internally within housing 210. The circuitry can be embodied on various circuit boards or on a single circuit board, such as in a SiP assembly, disposed within housing 210.

Figure 2B:
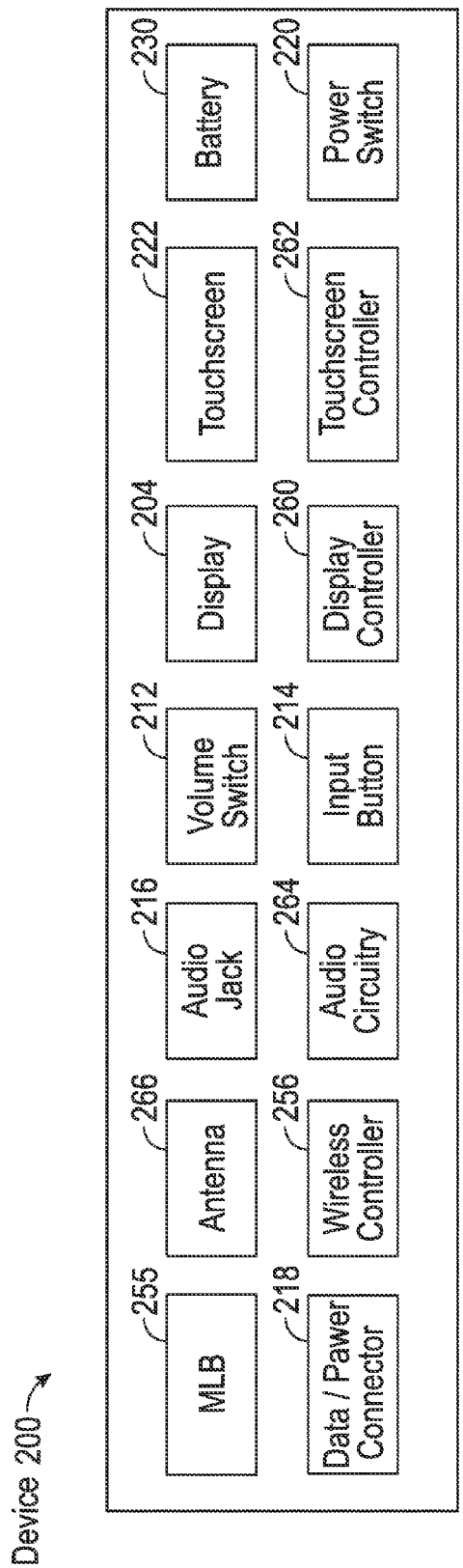
FIG. 2B illustrates a block diagram of an exemplary portable electronic device.

An exemplary block diagram of device 200 is shown in FIG. 2B. The components described above can be controlled by a processor on a MLB 255. Various internal connections can be provided that allow data to move between MLB 255 and the various components. The routing of internal data connections can depend on how various components are packaged including where MLB 255 is positioned within housing 210 and available internal pathways that result after positioning of the various internal device components.

In regards to data connections, MLB 255 can be coupled to a display controller 260, which can be coupled to display 204 (shown in FIG. 2A). Further, MLB 255 can be coupled to audio components, such as a speaker, an audio jack 216, and a microphone or associated audio circuitry 264 including an audio codec. Further, MLB 255 can be coupled to the various input devices, such as touchscreen 222 coupled to a touchscreen controller 262, input button circuitry, and power switch circuitry. In addition, MLB 255 can be coupled to various data interfaces, such as wireless controller 256, antenna 266, and data/power connector 218, that allow it to receive and send external data.

Besides data connections, many internal device components can receive power from an internal power source, such as battery 230. For instance, battery 230 can be coupled to MLB 255, display 204, display controller 260, touchscreen 222, touchscreen controller 262, and data/power connector 218. Like the data connections, routing of the power connections can depend on the positioning of the various internal device components, such as battery 230 and the available internal pathways within housing 210.

Figure 2C:
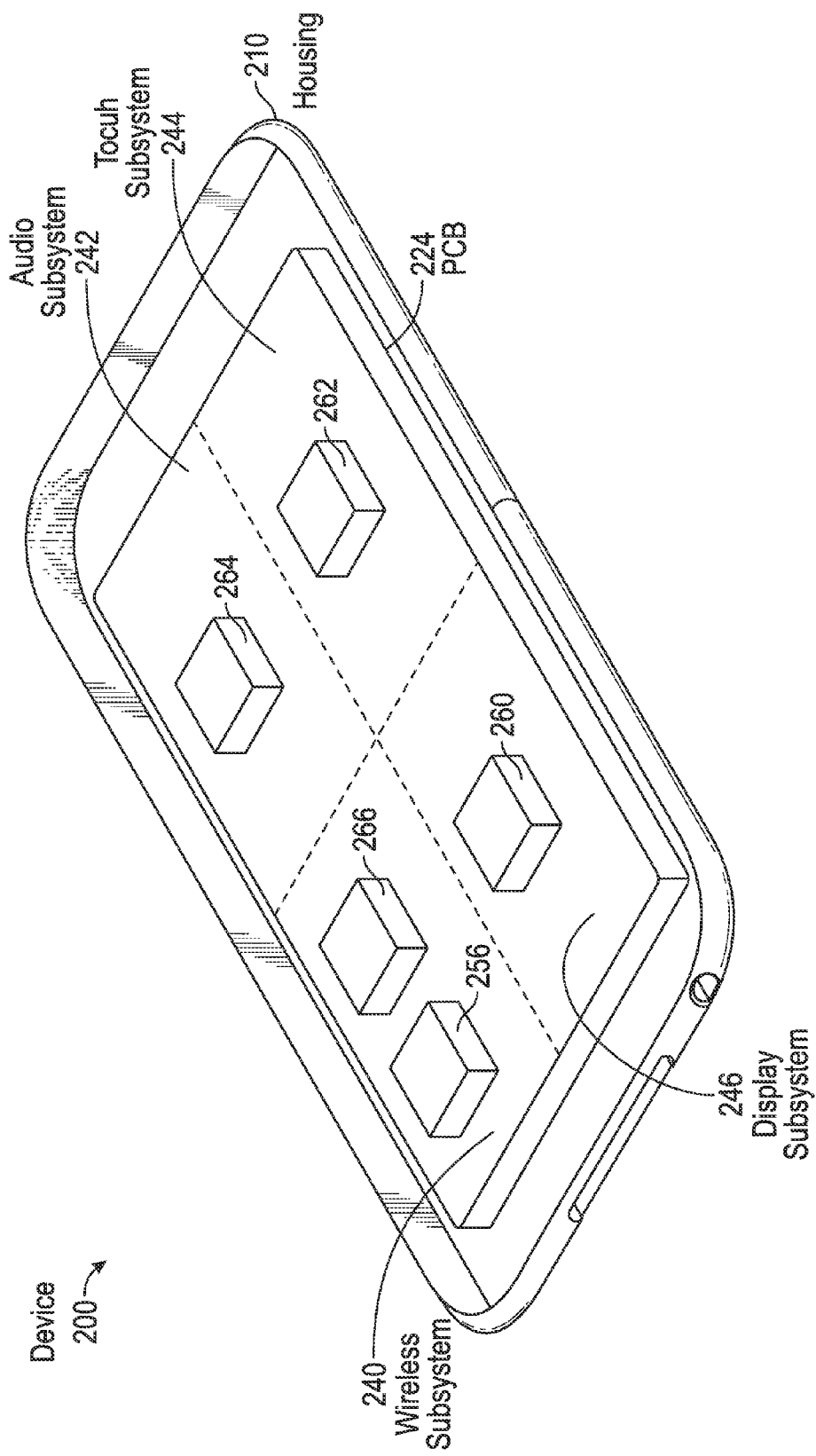
FIG. 2C illustrates a perspective view of an exemplary portable electronic device that includes components mounted on one or more printed circuit boards.

FIG. 2C illustrates a perspective view of an exemplary portable electronic device that includes components mounted on one or more PCBs. Device 200 can include housing 210 and multiple components such as wireless controller 256, antenna 266, audio circuitry 264, display controller 260, and touch controller 262 mounted on one or more circuit boards such as PCB 224 within housing 210. Components can include integrated circuits such as general purpose processing units, application-specific integrated circuits, radio-frequency components such as wireless transceivers, clock generation and distribution circuits, or other components such as discrete components. PCB 224 can be a MLB or another type of logic board.

Components can be grouped and arranged into subsystems based on their functionality. Example subsystems can include, but are not limited to, wireless subsystem 240, audio subsystem 242, touch subsystem 244, and display subsystem 246. One or more of the subsystems can produce and/or be susceptible to electromagnetic interference (EMI). Shielding structures can be used between and/or around one or more subsystems to help reduce EMI from reaching one or more components.

Figure 3A:
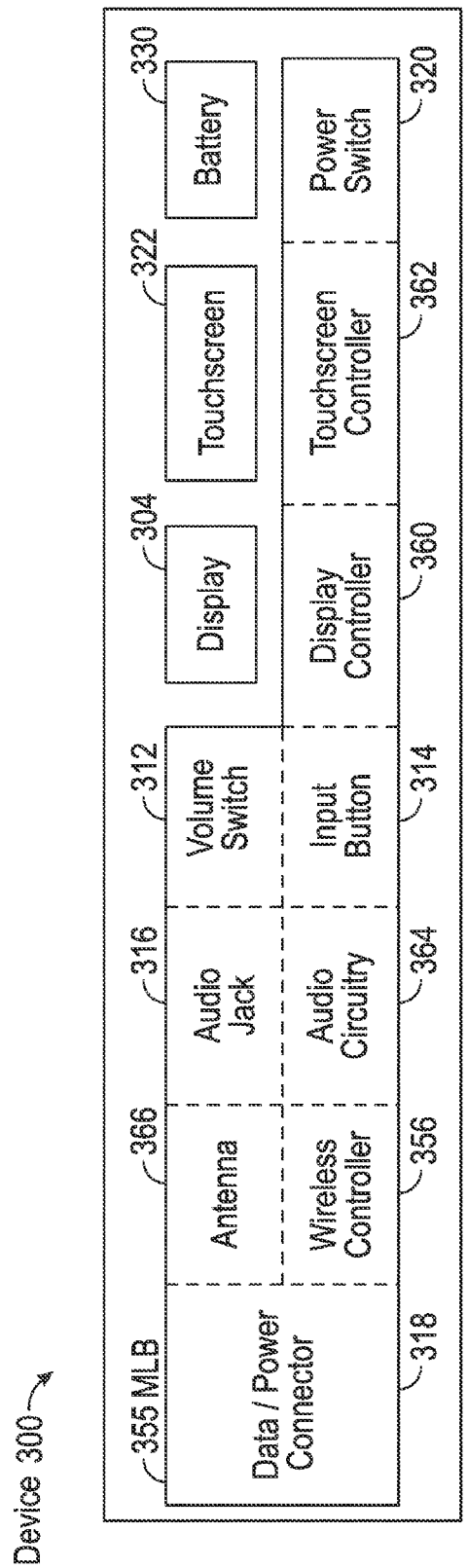
FIG. 3A illustrates an exemplary block diagram of an exemplary portable electronic device assembled into a SiP assembly according to examples of the disclosure.

To reduce the packaging size and the size of these compact portable electronic devices, components and circuitry can be integrated into a SiP assembly. FIG. 3A illustrates a block diagram of an exemplary portable electronic device assembled into a SiP assembly according to examples of the disclosure. Device 300 can include various circuitry that can be packaged into a single package or SiP assembly. Several tens or hundreds of electronic components including multiple dies, passive components, mechanical or optical components can be packaged in a single system on a PCB. Antenna 366, audio jack 316, volume switch 312, data/power connector 318, wireless controller 356, audio circuitry 364, input button 314, display controller 360, touchscreen controller 362, and power switch 320 can be included on MLB 355. MLB 355 can be coupled to display 304, touchscreen 322, and battery 330.

Figure 3B:
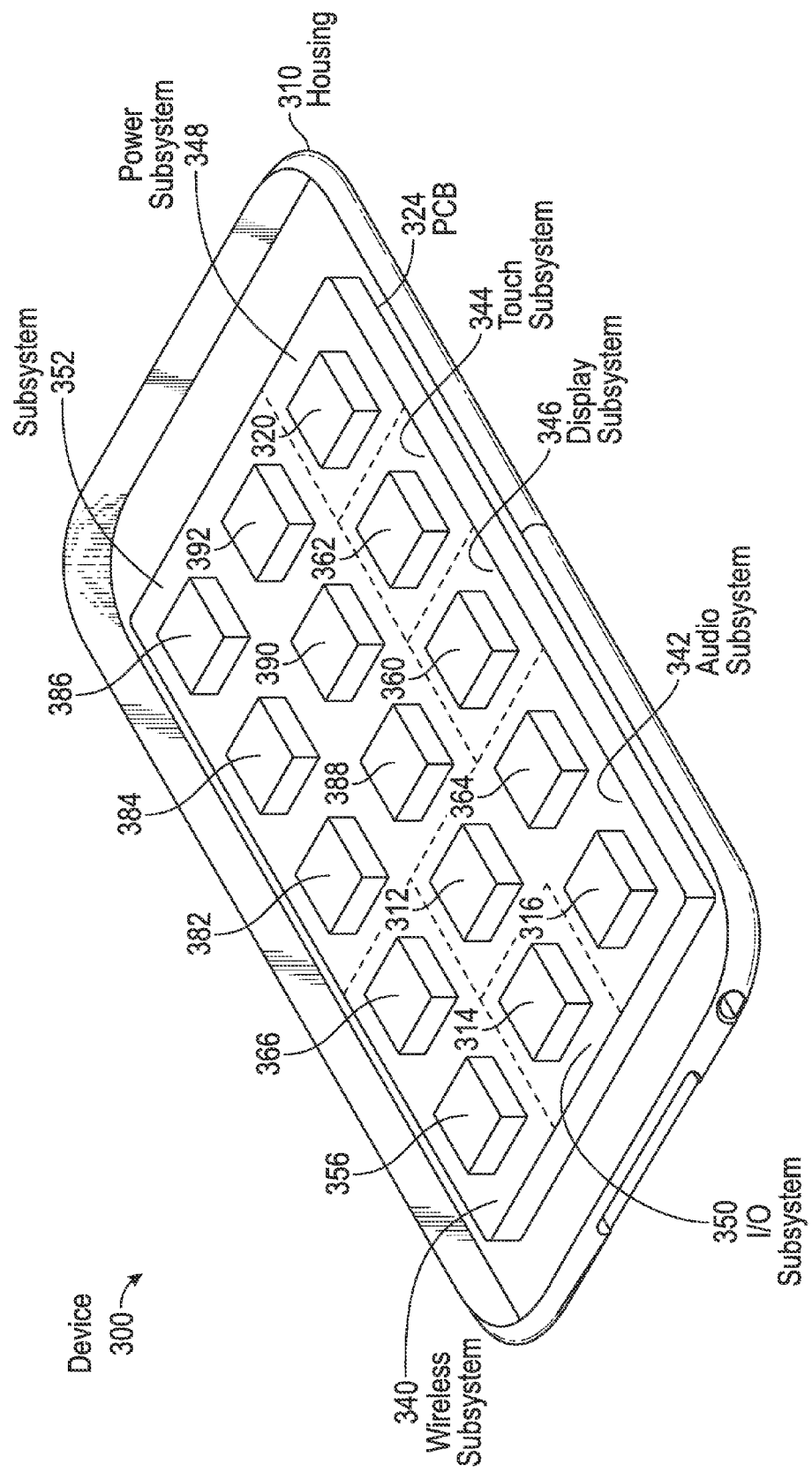
FIG. 3B illustrates a perspective view of an exemplary portable electronic device with components and circuitry integrated into a SiP assembly according to examples of the disclosure.

FIG. 3B illustrates a perspective view of an exemplary portable electronic device with components and circuitry integrated into a SiP assembly according to examples of the disclosure. Device 300 can include housing 310. Components and circuitry can be mounted and integrated on a PCB 324. Components can include wireless controller 356 and antenna 366 in wireless subsystem 340, input button 314 in I/O subsystem 350, audio jack 316, audio circuitry 364, and volume switch 312 in audio subsystem 342, display controller 360 in display subsystem 346, touchscreen controller 362 in touch subsystem 344, power switch 320 in power subsystem 348, and components 382-392 in subsystem 352. By integrating the components and circuitry into a SiP assembly, the size of the device can be reduced and/or the number of components can be increased.

Figure 4A:
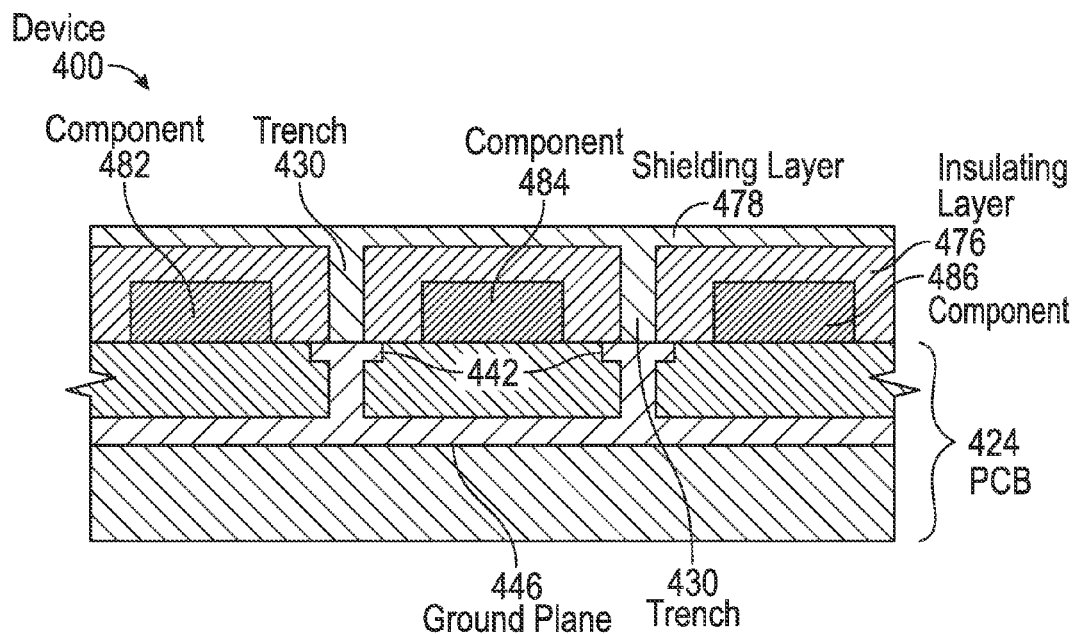
FIG. 4A illustrates a cross-sectional view of an exemplary portable electronic device assembled into a SiP assembly.

In some examples, one or more of the components can dissipate a lot of power. This power dissipation can result in the generation of heat that may need to be conducted away for better device performance and long-term reliability of the components. FIG. 4A illustrates a cross-sectional view of an exemplary portable electronic device assembled into a SiP assembly. Components 482, 484, and 486 can be mounted or disposed on PCB 424 using any mounting technique. To prevent internal and/or external interference, shielding structures can be disposed between one or more components. Shielding structures can include an insulating layer 476 and a shielding layer 478.

Insulating layer 476 can be used to prevent electrical shorting between shielding layer 478 and any conductive materials on PCB 424 (e.g., conductive portions of components 482, 484, and 486). Insulating layer 476 can be formed from epoxy, over-mold materials, under-fill materials, heat shrink jackets, acrylic materials, dielectric materials, thermoset materials, thermoplastics, rubbers, plastics, or other desirable materials that provide electrical insulation.

Shielding layer 478 can be formed on insulating layer 476 and/or in trenches 430 to shield the underlying components from EMI. Shielding layer 478 can include conductive materials such as silver paint, platinum paint, solder, metals such as copper or aluminum, metal alloys such as nickel-iron alloys, conductive adhesives, or other materials suitable for electromagnetic shielding. Shielding layer 478 can be formed in various configurations including walls, fences, sheets or layers, combinations of these configurations, or other desired configurations.

PCB 424 can include metal traces 442 and ground plane 446. Shielding layer 478 can couple to metal traces 442 and ground plane 446 to form shielding structures that enclose each subsystem and can help protect components 482, 484, and 486 from EMI (e.g., interference from external sources or internally between components of different subsystems). In some examples, metal traces 442 can be formed from conductive materials that help protect PCB 424 from cutting tools. For example, metal traces 442 can reflect lasers emitted by laser cutting tools used for forming trenches 430.

Figure 4B:
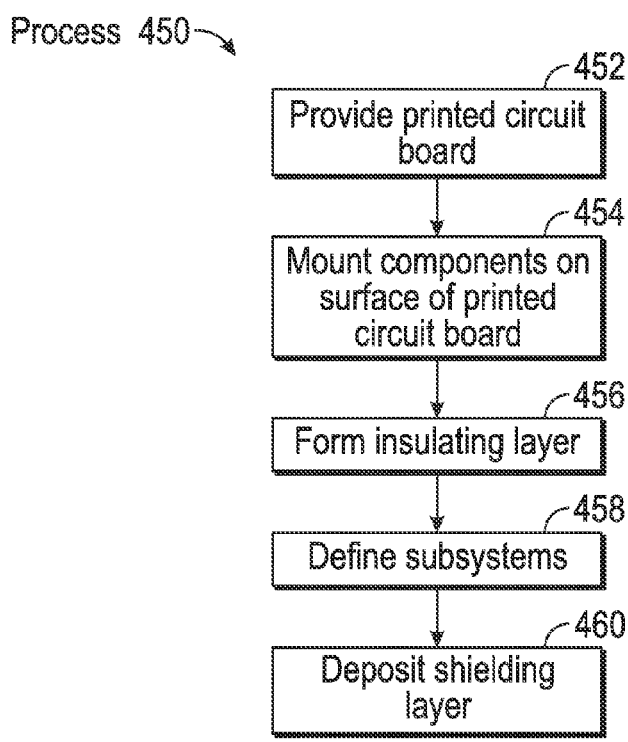
FIG. 4B illustrates a process for forming an exemplary portable device assembled into a SiP assembly.

FIG. 4B illustrates a process for forming an exemplary portable device assembled into a SiP assembly. Process flow 450 can include providing a substrate or PCB 424 (step 452). Components 482, 484, and 486 can be mounted on a surface of PCB 424 (step 454). Insulating layer 476 can be formed using an injection process or deposition process (step 456). For the injection process, molding tools can be used to mold insulating materials to form insulating layer 476, and the molded insulating layer 476 can be transferred to PCB 424. Molding tools can include injection molding tools, sintering tools, matrix molding tools, compression molding tools, transfer molding tools, extrusion molding tools, and other tools suitable for molding insulating materials into a desired configuration. Molding tools can be used to form structures that define the shape and location of the subsystems. For the deposition process, deposition tools can be used to deposit insulating layer 476 at desired locations on PCB 424. Deposition tools can include tools for injecting insulating materials (e.g., epoxy) into injection molding tools to form shielding structures. Deposition tools can also include thin-film deposition tools (e.g., chemical or physical vapor deposition tools) or other tools desirable for forming shielding structures.

In step 458, subsystems can be formed and defined. Each subsystem can enclose its respective components, and can be formed either during the injection process as described above or by scribing or etching trenches 430 using a cutting source. When using the injection process, molding structures (not shown) can have holes through which insulating material can be injected into a space inside the molding structures. After the injection process (e.g., after the insulating material is injected and sufficiently cooled), the molding structures can be removed. The insulating material can be heated prior and/or during injection using heating tools. Heating tools can include oil-based heating tools, gas-based heating tools, electrical-based heating tools, or any other heating tools suitable for heating the insulating material. Heating tools can, if desired, be used to apply pressure to the insulating layer 476 during formation. In some examples, the insulating layer 476 can be pre-formed and then placed on PCB 424 on components 482, 484, and 486. When using a cutting source to define each subsystem, trenches 430 can be formed by cutting through insulating layer 476 using cutting tools to isolate subsystems. Cutting tools can include sawing tools, laser cutting tools, grinding tools, drilling tools, electrical discharge machining tools, or other machining or cutting tools suitable for cutting through insulating layer 476.

In some examples, a width of trenches 430 can be minimized. A minimum trench width can be equal to the spacing required for neighboring components to be electrically isolated from one another while substantially filling up or occupying a board space, thereby reducing the board space or footprint required. For example, the width of trenches 430 can be about 10-100 µm. Small trench widths can lead to not only a reduced amount of required board space, but can also lead to enhanced aesthetic appeal and improved optical uniformity.

In step 460, shielding layer 478 can be deposited. Shielding layer 478 can be a plating film or thin-film metal deposited using any number of techniques, such as chemical vapor deposition, physical vapor deposition, plating, printing, or spray processes.

Figure 5:
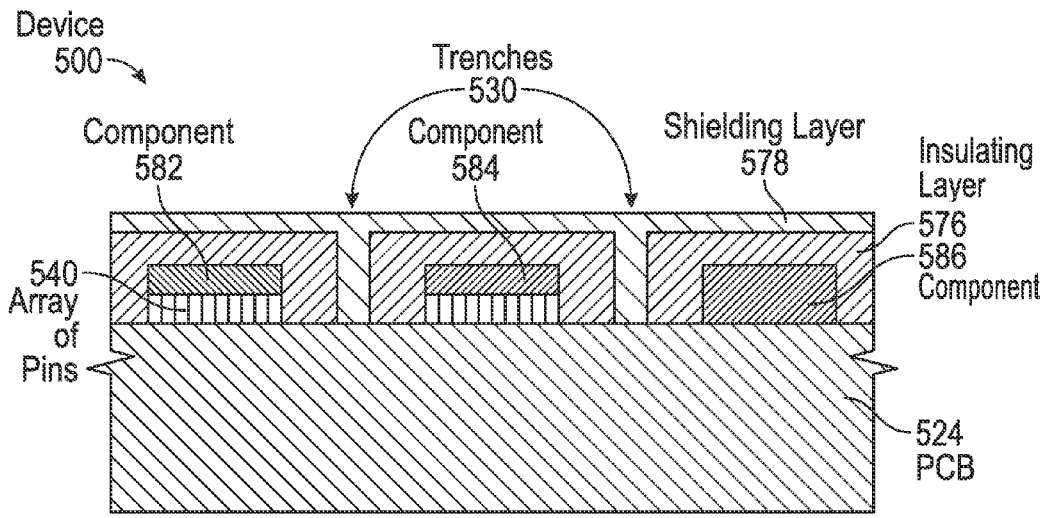
FIG. 5 illustrates a cross-sectional view of an exemplary portable electronic device assembled into a SiP assembly using pins or balls to dissipate heat.

FIG. 5 illustrates a cross-sectional view of an exemplary portable electronic device assembled into a SiP assembly using pins or balls to dissipate heat. Device 500 can include components 582, 584, and 586 mounted on PCB 524. Insulating layer 576 can be formed on and/or around components 582, 584, and 586 using any of the deposition techniques discussed above. One or more trenches 530 can be formed between subsystems, and trenches 530 can be filled or coated with shielding layer 578. Components 582 and 584 can be "hot" components that produce a lot of power and as a result, generate excess heat. Components 582 and 584 can be seated on an array of pins (or balls) 540. Array of pins 540 can be, for example, a ball grid array (BGA). BGAs can be a type of surface-mount packaging that includes discrete leads. The discrete leads can contact PCB 524, and can provide a heat path to transfer any heat generated by components 582 and 584 to PCB 524.

Although the array of pins 540 can provide a means of dissipating internal heat out of components 582 and 584, the heat can be transferred to PCB 524. Due to components 582, 584, and 586 being assembled into a single package (e.g., mounted on the same substrate or PCB 524), heat generated from one component can dissipate and affect neighboring components via the shared PCB 524. For example, heat generated from component 584 can be transferred via the array of pins 540 to PCB 524. However, PCB 524 can be in contact with component 586. As a result, heat generated from component 584 can be transferred to component 586, leading to component 586 becoming hot.

Figure 6A:
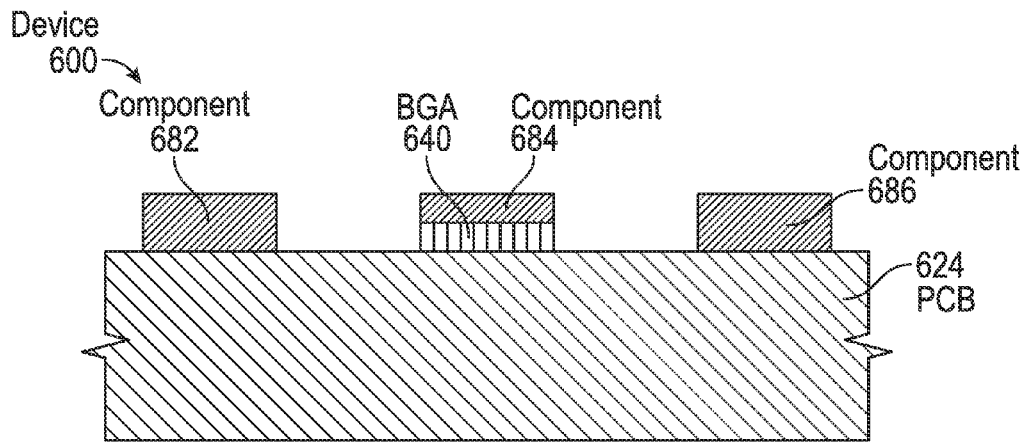
FIGS. 6A-6C illustrate cross-sectional views of an exemplary portable electronic device assembled into a SiP assembly using one or more thermal plugs to dissipate heat according to examples of the disclosure.
Figure 6B:
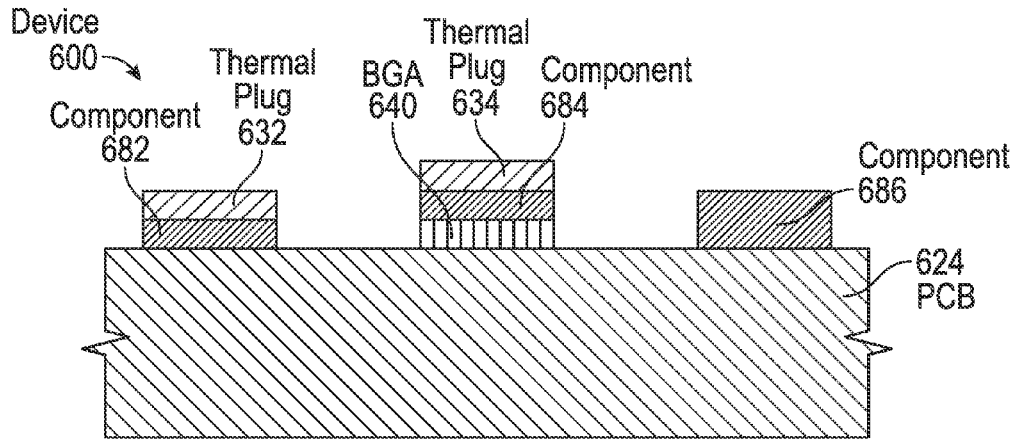
Figure 6C:
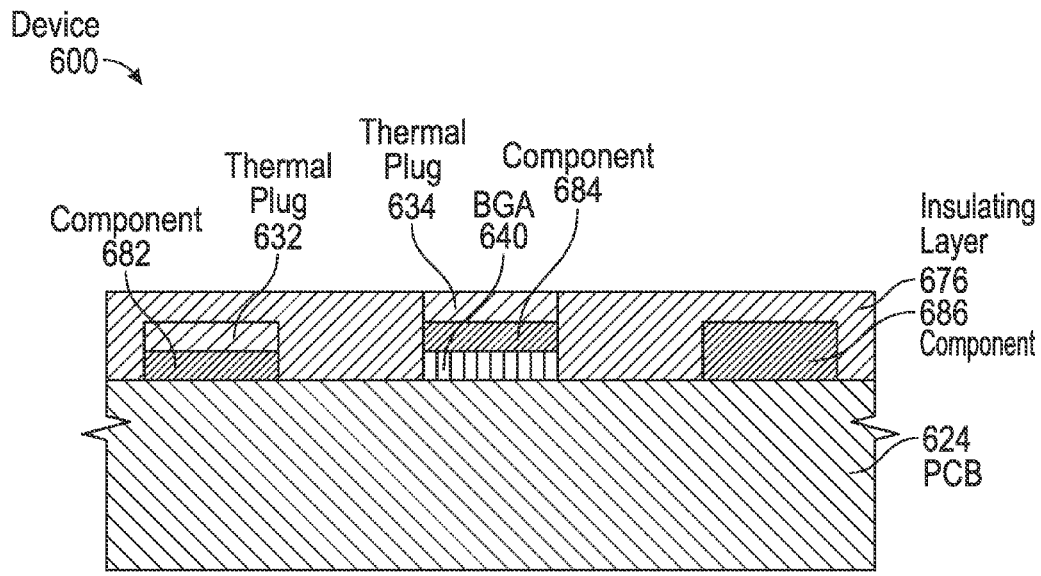

FIGS. 6A-6C illustrate cross-sectional views of an exemplary portable electronic device assembled into a SiP assembly using one or more thermal plugs to dissipate heat according to examples of the disclosure. Device 600 can include a substrate or PCB 624, as shown in FIG. 6A. Components 682, 684, and 686 can be mounted or disposed on PCB 624 using any mounting technique and using any suitable mounting material such as solder. In some examples, one or more components such as component 684 can be mounted on a heat sink such as BGA 640. As shown in FIG. 6B, one or more thermal plugs such as thermal plugs 632 and 634 can be formed on one or more components such as components 682 and 684. Thermal plugs 632 and 634 can be blocks made from metal, such as Copper or Steel, that can be pre-fabricated to be a same size as a corresponding component. In some examples, thermal plugs 632 and 634 can be a different size than a corresponding component. Thermal plugs 632 and 634 can be any shape or size including, but not limited to, circular or rectangular shapes. Thermal plugs 632 and 634 can be mounted or attached to components 682 and 684 using any suitable thermal adhesive material such as Indium.

As shown in FIG. 6C, insulating layer 676 can be formed on and/or around components 682, 684, and 686 and thermal plugs 632 and 634. Insulating layer 676 can be an epoxy, over-mold material, under-fill material, heat shrink jacket, acrylic material, dielectric material, thermoset material, thermoplastic, rubber, plastic, or other desirable material that provides electrical insulation. In some examples, insulating layer 676 can be formed using insulating materials that are both electrically insulating and thermally conductive. For example, insulating material can include thermally conductive plastics, epoxy, or other thermally conductive materials. Insulating materials that are thermally conductive can be used to draw heat away from components 682, 684, and 686. In some examples, insulating layer 676 can be thermally conductive and can include electrically insulating filler particles.

Figure 6D:
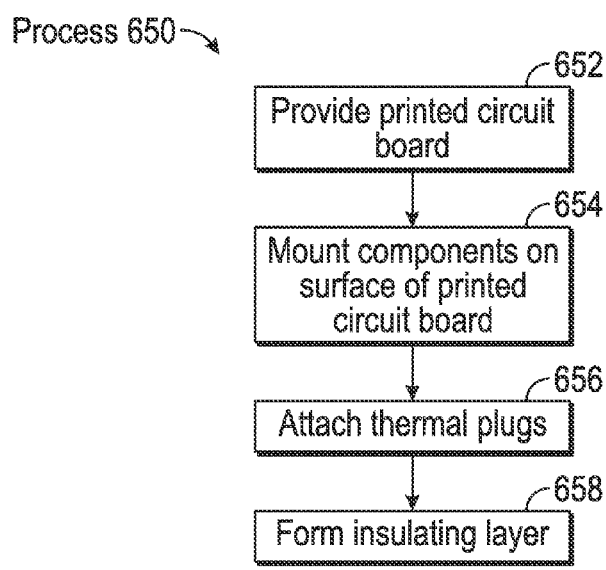
FIG. 6D illustrates a process for forming an exemplary portable electronic device assembled into a SiP assembly using one or more thermal plugs to dissipate heat according to examples of the disclosure.

FIG. 6D illustrates a process for forming an exemplary portable electronic device assembled into a SiP assembly using one or more thermal plugs to dissipate heat according to examples of the disclosure. Process 650 can include providing PCB 624 (step 652). In step 654, components 682, 684, and 686 can be mounted on PCB 624. Step 654 can include attaching BGA 640 to component 684. In some examples, BGA 640 can be attached to component 684 before mounting component 684 to PCB 624. In some examples, BGA 640 can be attached to PCB 624 followed by attaching component 684 to BGA 640. In step 656, one or more thermal plugs such as thermal plugs 632 and 634 can be mounted on or attached to one or more components such as components 682 and 684. In some examples, thermal plugs 632 and 634 can be attached to components 682 and 684 before components 682 and 684 are mounted to PCB 624.

In step 658, insulating layer 676 can be formed. In some examples, insulating layer 676 can be deposited using a deposition tool. In some examples, insulating material can be injected into a space inside a molding structure. In some examples, insulating layer 676 can be formed using a tape-assisted transfer molding process. The tape-assisted transfer molding process can be a process where certain areas are masked when the insulating material is injected. Once the injection is complete, a top surface of the masked areas can be flush with a top surface of insulating layer 676. For example, as shown in FIG. 6B, a top surface of thermal plug 634 can be masked during the tape-assisted transfer molding process. Insulating material can be injected and can form on thermal plug 632 and component 686 (as shown in FIG. 6C). However, since thermal plug 634 was masked, insulating layer 676 may not form on a top surface of thermal plug 634 leading to the top surface of thermal plug 634 being flush with a top surface of insulating layer 676.

Figure 7A:
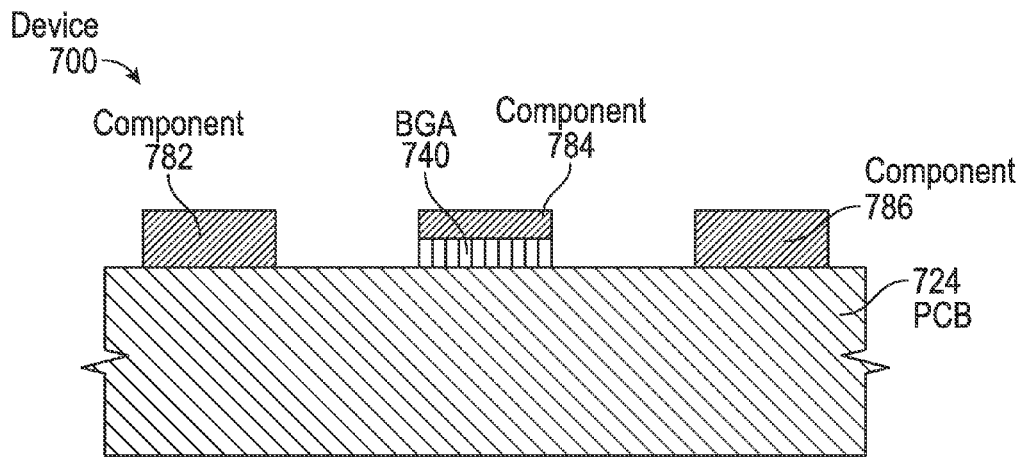
FIGS. 7A-7D illustrate cross-sectional views of an exemplary portable electronic device assembled into a SiP assembly using one or more thermal plugs and a heat spreader to dissipate heat according to examples of the disclosure.
Figure 7B:
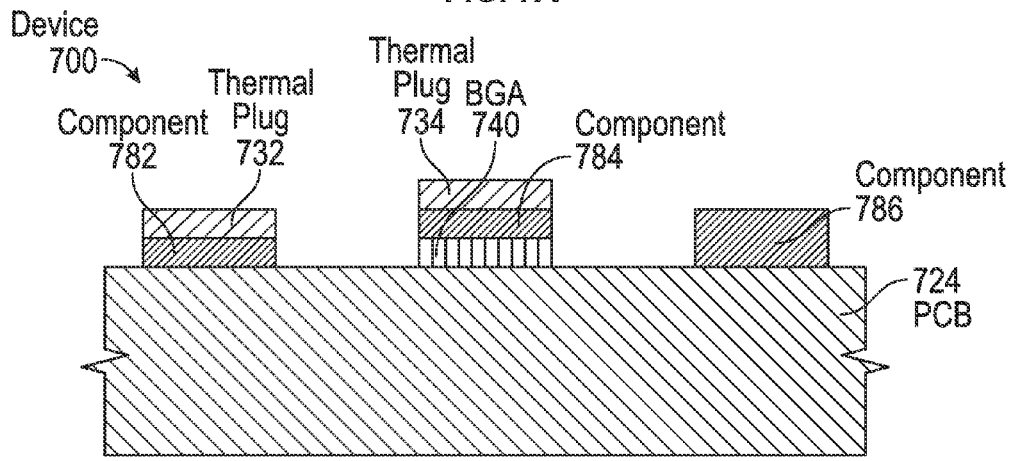
Figure 7C:
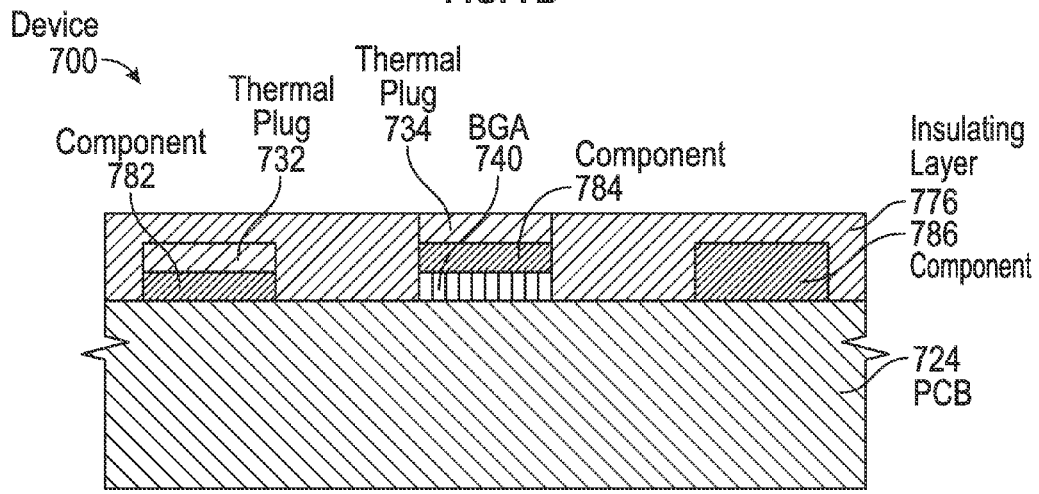
Figure 7D:
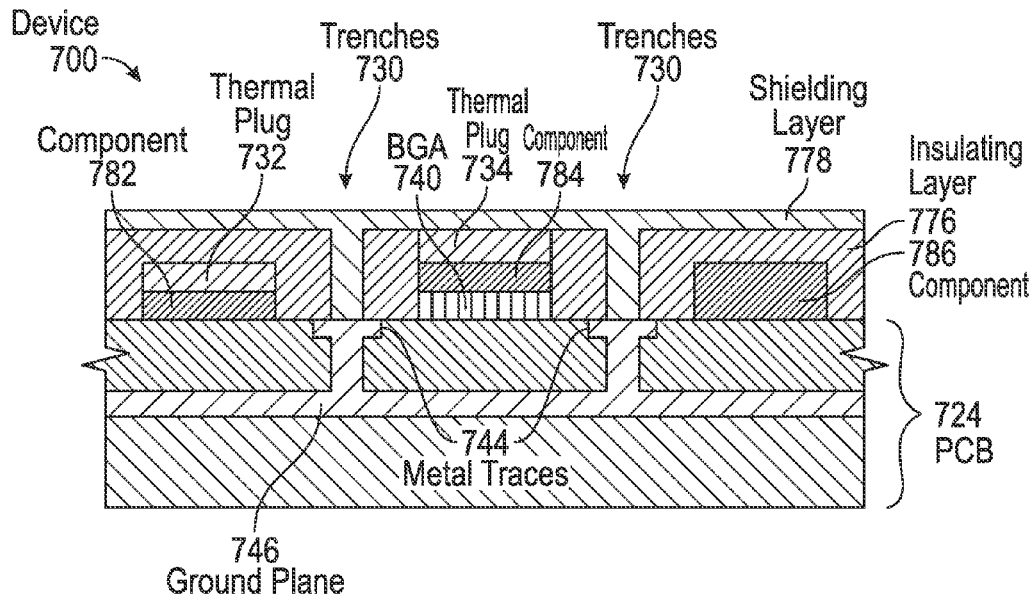
Figure 7E:
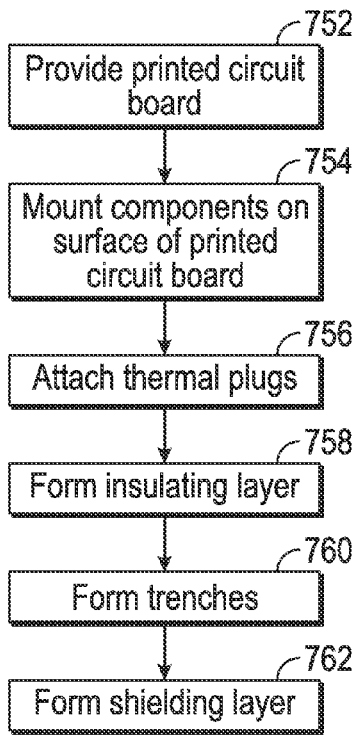
FIG. 7E illustrates a process for forming an exemplary portable electronic device assembled into a SiP assembly using one or more thermal plugs and a heat spreader to dissipate heat according to examples of the disclosure.

FIGS. 7A-7D illustrate cross-sectional views and FIG. 7E illustrates a process for forming an exemplary portable electronic device assembled into a SiP assembly using one or more thermal plugs and a heat spreader to dissipate heat according to examples of the disclosure. Process 750 can include providing device 700 with a substrate or PCB 724 (step 752), as shown in FIG. 7A. Components 782, 784, and 786 can be mounted or disposed on PCB 724 using any mounting technique (step 754) and using any suitable mounting material such as solder. In some examples, one or more components such as component 784 can be mounted on an array of pins such as BGA 740.

As shown in FIG. 7B, one or more thermal plugs such as thermal plugs 732 and 734 can be attached to one or more components such as components 782 and 784 (step 756). Thermal plugs 732 and 734 can be one or more pre-fabricated blocks of metal such as Copper or Steel. Thermal plugs 732 and 734 can be any shape or size including, but not limited to, circular or rectangular shapes. In some examples, thermal plugs 732 and 734 can be a same size as components 782 and 784. In some examples, thermal plugs 732 and 734 can be a different size than component 782 and 784. Thermal plugs 732 and 734 can be mounted or attached to components 782 and 784 using any suitable thermal adhesive material such as Indium.

As shown in FIG. 7C, insulating layer 776 can be formed on and/or around components 782, 784, and 786 and thermal plugs 732 and 734 (step 758). Insulating layer 776 can be an epoxy, over-mold material, under-fill material, heat shrink jacket, acrylic material, dielectric material, thermoset material, thermoplastic, rubber, plastic, or other desirable material that provides electrical insulation. In some examples, insulating layer 776 can be formed using insulating materials that are electrically insulating and thermally conductive such as thermally conductive plastics, epoxy, or other thermally conductive materials. Insulating layer 776 can be formed using a tape-assisted transfer molding process.

The SiP assembly process can further include cutting or forming trenches 730 in insulating layer 776 between components or subsystems (step 760), as shown in FIG. 7D. Trenches 730 can be formed to isolate and define subsystems and can be filled or walls can be coated using a shielding layer 778 (step 762). Shielding layer 778 can be made from any shielding material such as a plating film or a metallic paste. Exemplary materials for shielding layer 778 can include, but are not limited to, Copper, Nickel, and Aluminum. Shielding layer 778 can be formed using chemical vapor deposition, physical vapor deposition, electroless plating, or electrochemical plating techniques.

Shielding layer 778 can be multi-functional and can also function as a heat spreader. In some examples, shielding layer 778 can be a multilayer stack with at least one layer configured to shield EMI and at least one layer configured to spread heat. Shielding layer 778 can be coupled to a ground such as ground plane 746 through metal traces 744. Shielding layer 778 can dissipate and spread heat transferred by thermal plugs 732 and 734 to PCB 724. For example, heat generated by component 784 can be dissipated through thermal plug 734 attached to component 784. Thermal plug 734 can be coupled to shielding layer 778. Shielding layer 778 can act as a heat spreader, and heat can further dissipate through shielding layer 778. Shielding layer 778 can be coupled to ground plane 746 through metal traces 744. Heat from shielding layer 778 can transfer to ground plane 746, and ground plane 746 can spread or disperse the heat throughout PCB 724. In some examples, ground plane 746 can be coupled to a housing (such as housing 210 of FIG. 2A).

In some examples, shielding layer 778 can be touching or in electrical contact with one or more thermal plugs to enhance the effectiveness of the heat spreading functionality. A top surface of insulating layer 776 can be flush with one or more thermal plugs such as thermal plug 734. To achieve a flush top surface, insulating layer 776 can undergo lapping, polishing, or dry etching to remove any excess material. In some examples, a flush top surface can be achieved using a tape-assisted transfer molding process. In some examples, shielding layer 778 can be electrically insulated from one or more thermal plugs. For example, shielding layer 778 and thermal plug 732 can be separated by an air gap or by insulating layer 776.

Figure 8A:
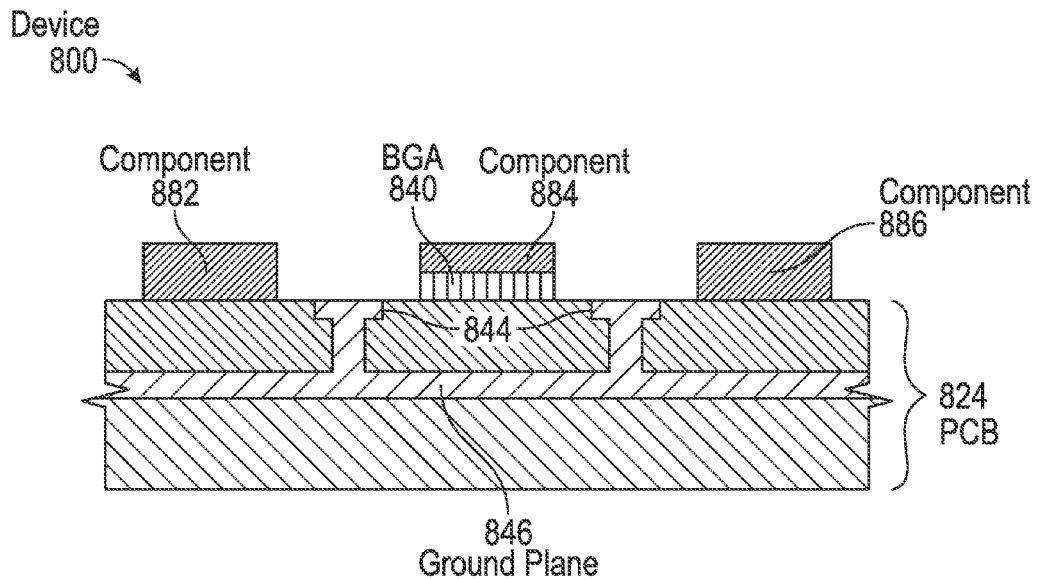
FIGS. 8A-8D illustrate cross-sectional views of an exemplary portable electronic device assembled into a SiP assembly using one or more heat sinks and a heat spreader to dissipate heat according to examples of the disclosure.
Figure 8B:
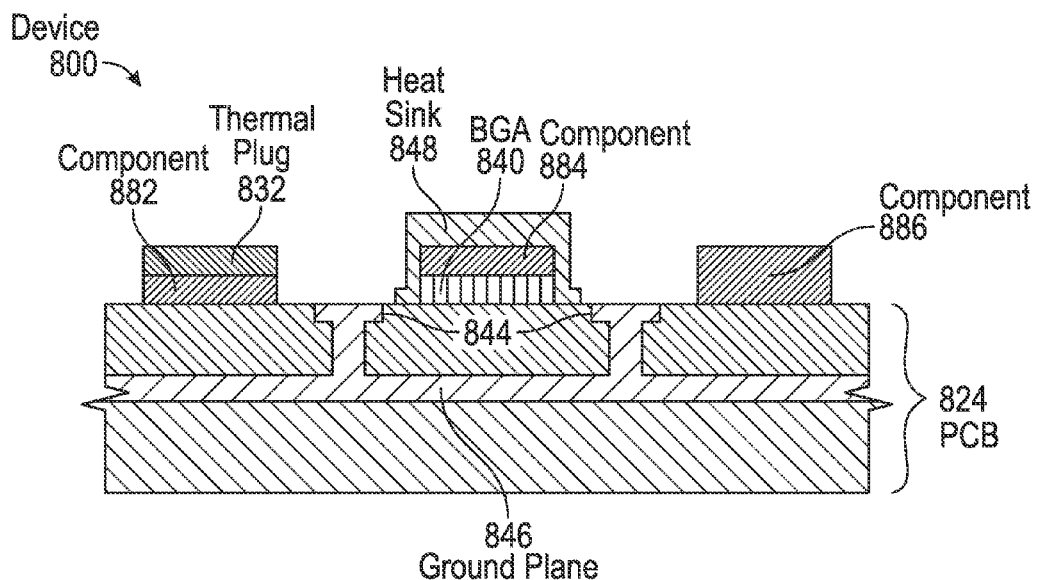
Figure 8C:
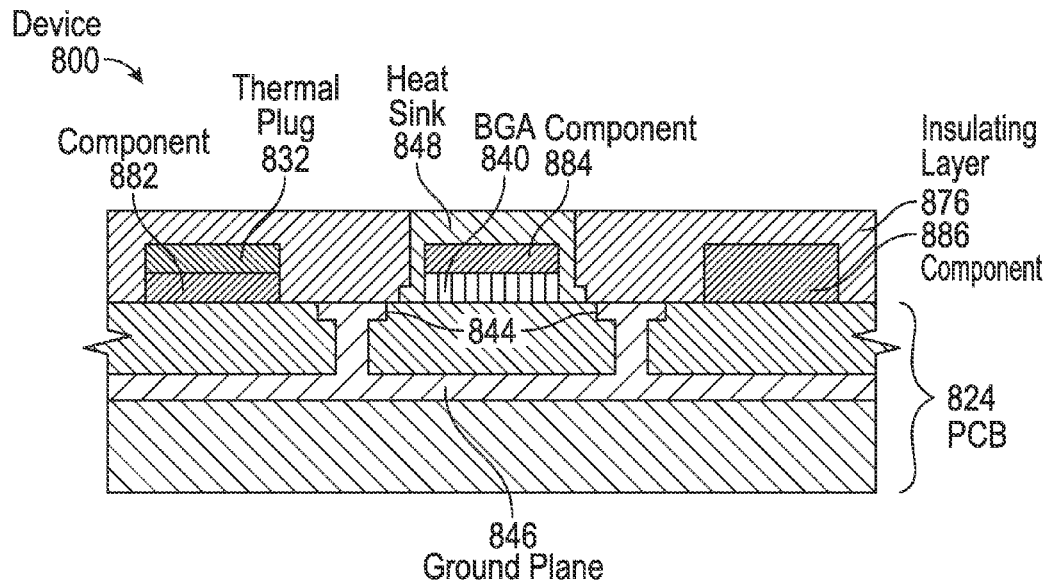
Figure 8D:
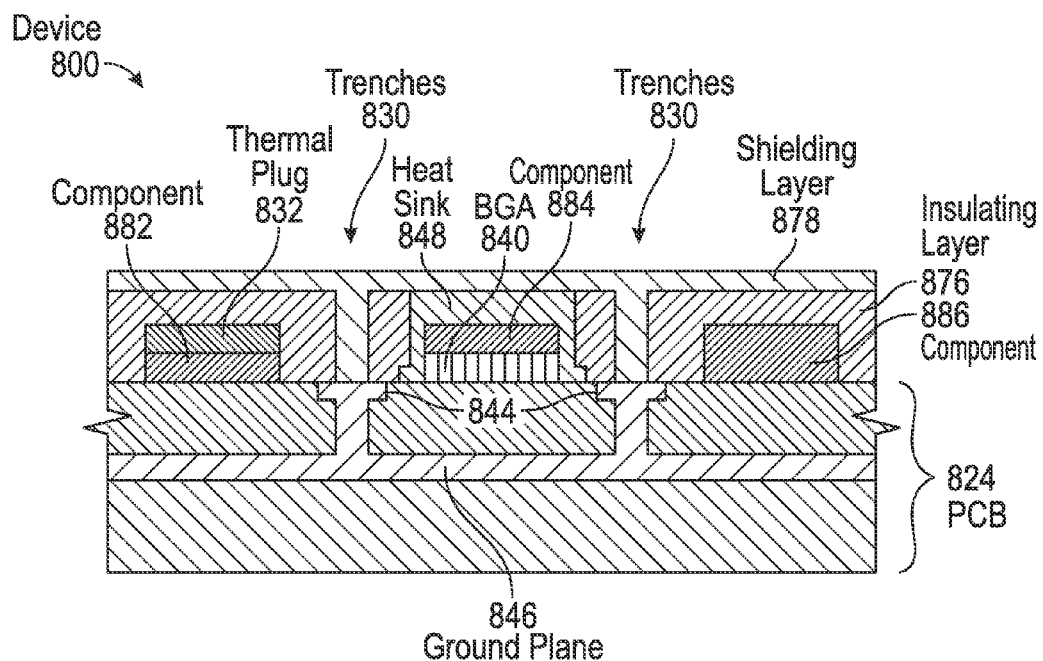
Figure 8E:
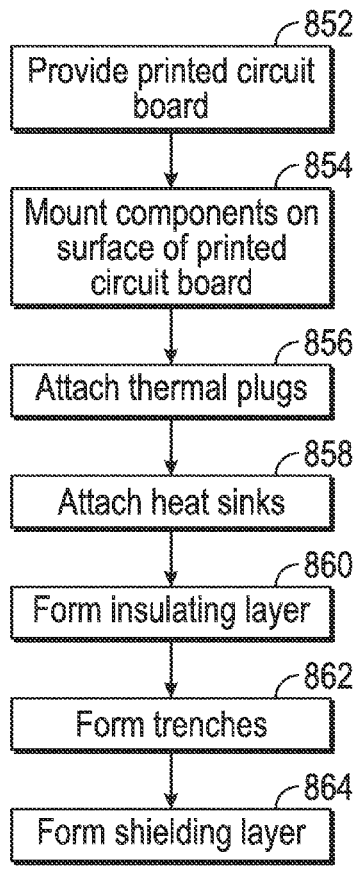
FIG. 8E illustrates a process for forming an exemplary portable electronic device assembled into a SiP assembly using one or more heat sinks and a heat spreader to dissipate heat according to examples of the disclosure.

FIGS. 8A-8D illustrate cross-sectional views and FIG. 8E illustrates a process for forming an exemplary portable electronic device assembled into a SiP assembly using one or more heat sinks and a heat spreader to dissipate heat according to examples of the disclosure. Device 800 can include a PCB 824 provided in step 852 of process 850. PCB 824 can include a ground plane 846 and metal traces 844. As shown in FIG. 8A, components 882, 884, and 886 can be mounted on PCB 824 using any suitable mounting material such as solder (step 854).

As shown in FIG. 8B, one or more thermal plugs such as thermal plug 832 can be attached to one or more components such as component 882 (step 856). In step 858, one or more heat sinks such as heat sink 848 can be attached to one or more components such as component 884. Heat sink 848 can be an internal embedded heat sink, and can be touching or attached to component 884 using a suitable thermal interface material. In some examples, heat sink 848 can attach to PCB 824 to create an additional heat conduction path to the substrate or PCB 824. Heat sink 848 can be electrically coupled or touching metal traces 844. In some examples, heat sink 848 can be bonded to PCB 824. In some examples, step 856 and step 858 can be a single step, and thermal plug 832 and heat sink 848 can be attached at a same time.

As shown in FIG. 8C, insulating layer 878 can be disposed on and/or around components 882, 884, and 886, thermal plug 832, and heat sink 848 to prevent electrical shorting between the subsequently formed shielding layer 876 and any conductive materials on PCB 824 (e.g., conductive portions of components 882, 884, and 886) (step 860). Any material that has sufficient insulating properties can be used for insulating layer 876, and any number of deposition or molding processes can be used to form insulating layer 876. In some examples, a top surface of insulating layer 876 and a top surface of thermal plug 832 and/or heat sink 848 can be flush.

In step 862, one or more trenches 830 can be formed using a laser cutting source, for example (as shown in FIG. 8D). Trenches 830 can isolate components and define subsystems. A shielding layer 878 and/or heat spreader can be deposited to fill or coat the walls of trenches 830 and conformally cover insulating layer 876 (step 864). Shielding layer 876 can be any material that has a high density, high conductivity, and/or good corrosion resistance. Shielding layer 876 can be formed using any deposition tools such as physical vapor deposition, chemical vapor deposition, printing, or plating. In some examples, shielding layer 876 can electrically contact or touch one or more thermal plugs and/or one or more heat sinks.

In some examples, heat sink 848 can be attached to tall components (e.g., components with a height greater than a predetermined value), and thermal plug 832 can be attached to short components (e.g., components with a height less than a predetermined value). For example, component 884 can be a tall component or taller than component 882, and heat sink 848 can be attached to component 884 while thermal plug 832 can be attached to component 882. In some examples, heat sink 848 can be attached to short components, and thermal plug 832 can be attached to tall components. In some examples, heat sink 848 can be attached to components that have certain characteristics, and thermal plug 832 can be attached to components that exhibit other characteristics. For example, to prevent hot spots or non-uniform heat dispersion, heat sinks 848 can be dispersed throughout and thermal plugs 832 can be dispersed between heat sinks (e.g., heat sinks and thermal plugs can be arranged in an alternating pattern).

Figure 9A:
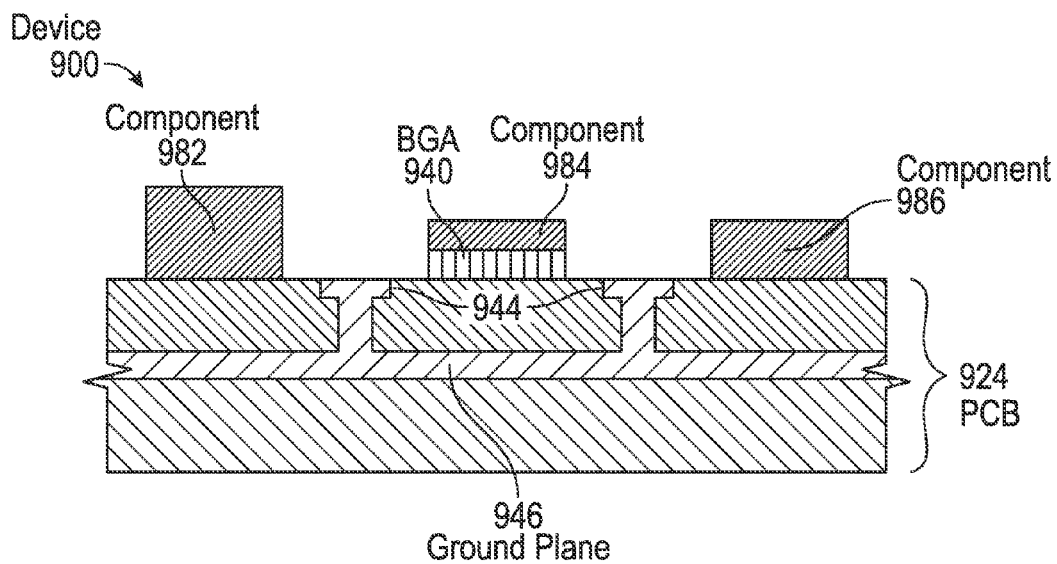
FIGS. 9A-9E illustrate cross-sectional views of an exemplary portable electronic device assembled into a SiP assembly using an external heat sink to dissipate heat according to examples of the disclosure.
Figure 9B:
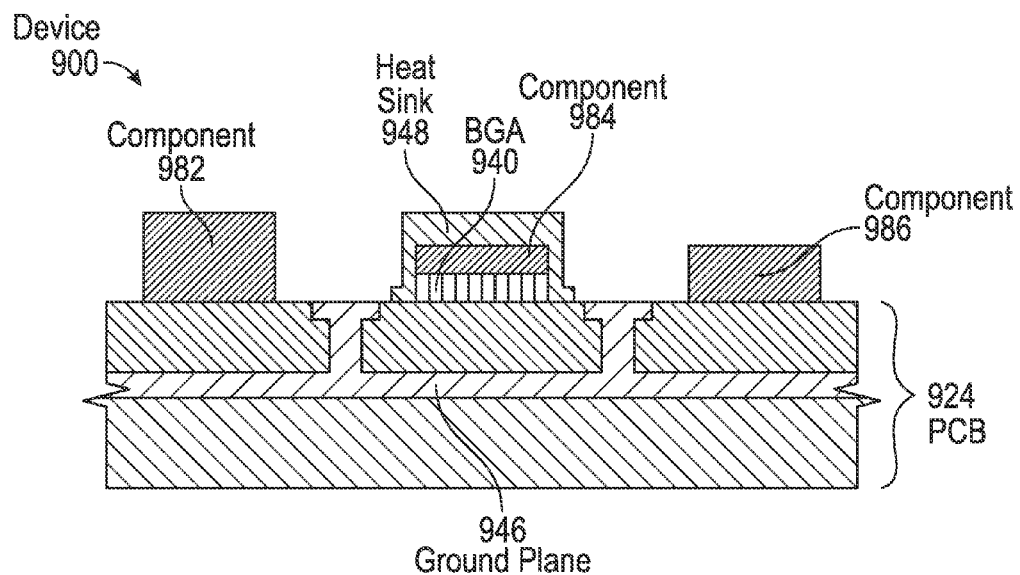
Figure 9C:
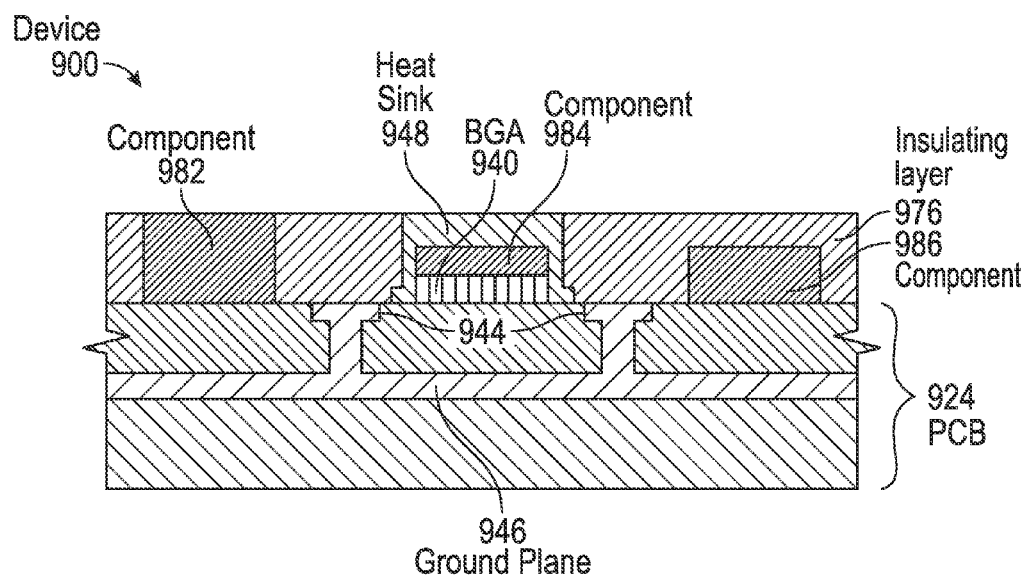
Figure 9D:
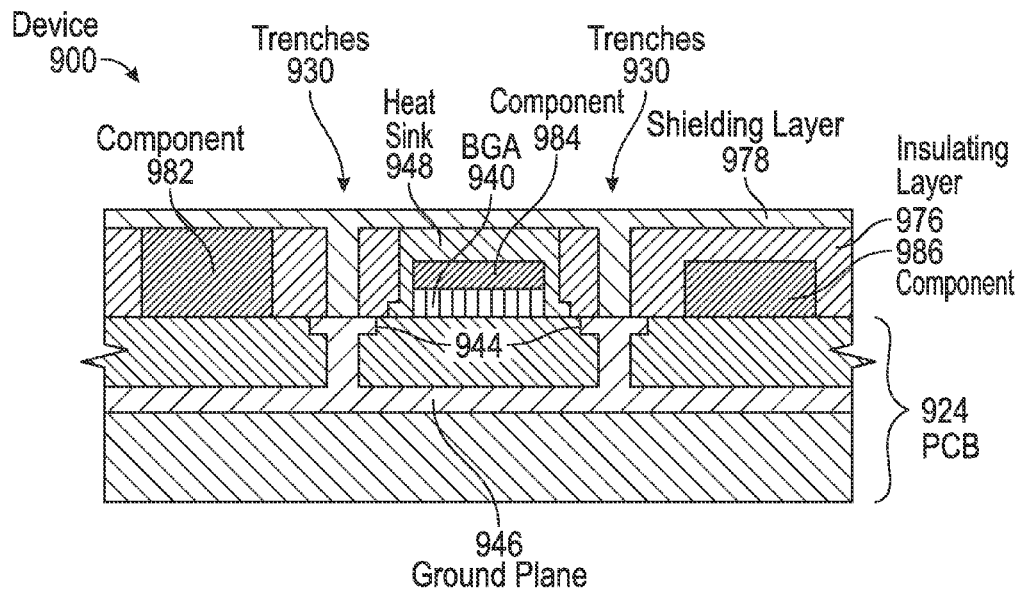
Figure 9E:
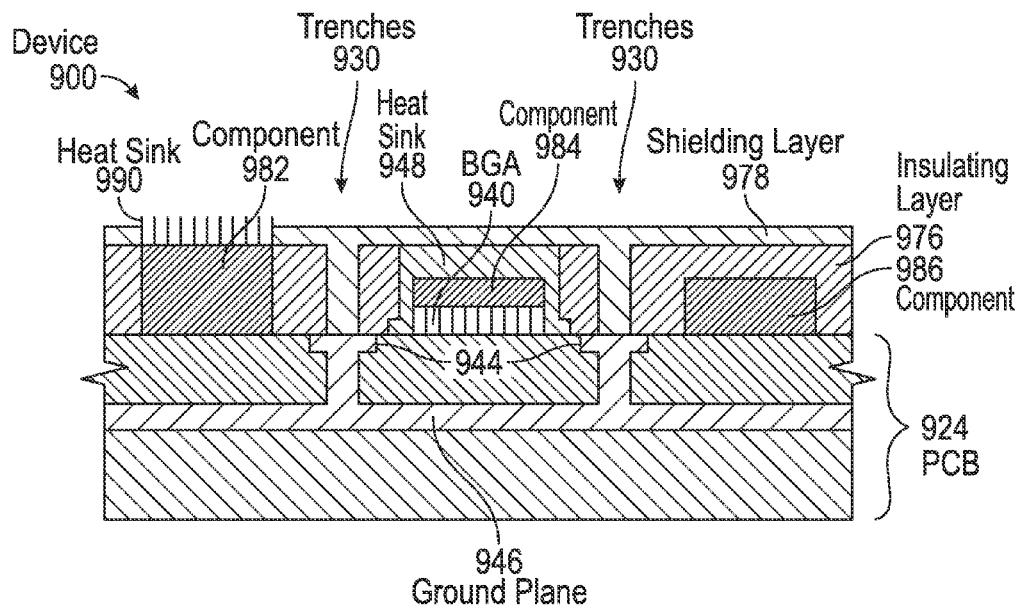
Figure 9F:
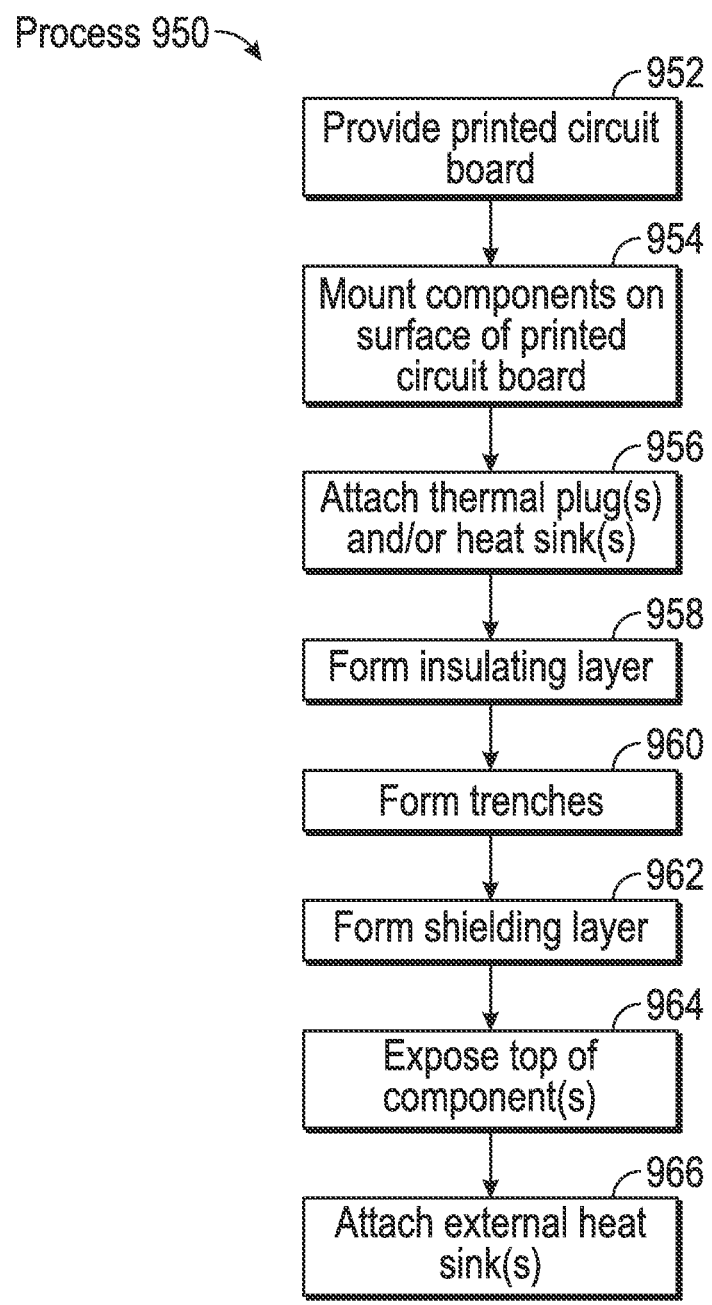
FIG. 9F illustrates a process for forming an exemplary portable electronic device assembled into a SiP assembly using an external heat sink to dissipate heat according to examples of the disclosure.

FIGS. 9A-9E illustrate cross-sectional views and FIG. 9F illustrates a process for forming an exemplary portable electronic device assembled into a SiP assembly using an external heat sink to dissipate heat according to examples of the disclosure. As shown in FIG. 9A, device 900 can include PCB 924 (step 952 in process 950). PCB 924 can include a ground plane 946 and metal traces 944. Components 982, 984, and 986 can be mounted or disposed on PCB 924 using any mounting technique and using any suitable mounting material such as solder (step 954). One or more components such as component 984 can be attached to a BGA 940. As shown in FIG. 9B, one or more thermal plugs and/or heat sinks such as heat sink 948 can be attached to one or more components such as component 984 (step 956).

In step 958, insulating layer 976 can be disposed on and/or around components 982, 984, and 986 and heat sink 948 (as shown in FIG. 9C). In some examples, one or more components such as component 982 can have a top surface that is flush with a top surface of insulating layer 976. In step 960, trenches 930 can be formed in insulating layer 976.

As shown in FIG. 9D, shielding layer 978 can be disposed on insulating layer 976 and can fill and/or cover the walls of trenches 930 (step 962). In step 964, one or more areas of shielding layer 978 can be etched away to expose a top surface of one or more components such as component 982. In some examples, top surface of component 982 can be exposed by masking the area during deposition of shielding layer 978. In step 966, an external heat sink 990 can be attached to the exposed top surface of component 982 (as shown in FIG. 9E). In some examples, external heat sink 990 can be electrically coupled to shielding layer 978. Heat from component 982 can be dissipated through external heat sink 990 (e.g., convention through the top) or through PCB 924 via shielding layer 978 (e.g., conduction through the bottom) or both.

In some examples, an electronic device is disclosed. The electronic device may comprise: a substrate; and a system in package assembly comprising: a plurality of components, the plurality of components including a first surface mounted to the substrate and a second surface, and one or more heat conductors mounted to the second surface of at least one component, wherein at least one heat conductor is a thermal plug. Additionally or alternatively to one or more examples disclosed above, in other examples, the device further comprises: another heat conductor, wherein the another heat conductor is at least one of an internal heat sink and an external heat sink. Additionally or alternatively to one or more examples disclosed above, in other examples, the thermal plug is made from at least one of Copper and Steel. Additionally or alternatively to one or more examples disclosed above, in other examples, at least one of the heat conductors is electrically coupled to a ground or ground plane. Additionally or alternatively to one or more examples disclosed above, in other examples, the device further comprises: a heat sink mounted between the first surface of at least one of the plurality of components and the substrate. Additionally or alternatively to one or more examples disclosed above, in other examples, the device further comprises: a shielding structure, the shielding structure including an insulator and a shielding. Additionally or alternatively to one or more examples disclosed above, in other examples, the shielding is multifunctional and is configured as a heat spreader. Additionally or alternatively to one or more examples disclosed above, in other examples, the shielding and at least one heat conductor are electrically coupled. Additionally or alternatively to one or more examples disclosed above, in other examples, the shielding is electrically coupled to a ground or ground plane. Additionally or alternatively to one or more examples disclosed above, in other examples, the device further comprises: a plurality of trenches formed in the insulator, wherein a width of the plurality of trenches is between 10-100 microns. Additionally or alternatively to one or more examples disclosed above, in other examples, heat generated from one or more of the plurality of components is dissipated through conduction and convection. Additionally or alternatively to one or more examples disclosed above, in other examples, the one or more heat conductors includes a plurality of thermal plugs and a plurality of heat sinks. Additionally or alternatively to one or more examples disclosed above, in other examples, the plurality of thermals plugs and the plurality of heat sinks are arranged in an alternating pattern.

In some examples, a method for forming an electronic device is disclosed. The method may comprise: forming a substrate; and forming a system in package assembly, comprising: mounting a first surface of a plurality of components to the substrate, and mounting one or more heat conductors to a second surface of at least one of the plurality of components, wherein at least one of the one or more heat conductors is a thermal plug. Additionally or alternatively to one or more examples disclosed above, in other examples, the one or more heat conductors includes another heat conductor, the another heat conductor is at least one of an internal heat sink and an external heat sink. Additionally or alternatively to one or more examples disclosed above, in other examples, the method further comprises: mounting a heat sink between the first surface of at least one of the plurality of components and the substrate. Additionally or alternatively to one or more examples disclosed above, in other examples, the method further comprises: forming a shielding structure, wherein forming the shielding structure includes forming an insulator and forming a shielding. Additionally or alternatively to one or more examples disclosed above, in other examples, the insulator is formed using at least one of a tape-assisted transfer molding process, lapping, polishing, and etching. Additionally or alternatively to one or more examples disclosed above, in other examples, the one or more heat conductors includes a plurality of thermal plugs and a plurality of heat sinks. Additionally or alternatively to one or more examples disclosed above, in other examples, the one or more heat conductors includes a first set of heat conductors and a second set of heat conductors and mounting one or more heat conductors comprises: mounting the plurality of thermal plugs to the first set of heat conductors, the first set of heat conductors including the one or more heat conductors with a height below a predetermined value; and mounting the plurality of heat sinks to the second set of heat conductors, the second set of heat conductors including the one or more heat conductors with a height above the predetermined value.

While various examples have been described above, it should be understood that they have been presented by way of example only, and not by way of limitation. Although examples have been fully described with reference to the accompanying drawings, the various diagrams can depict an example architecture or other configuration for this disclosure, which is done to aid in the understanding of the features and functionality that can be included in the disclosure. The disclosure is not restricted to the illustrated exemplary architectures or configurations, but can be implemented using a variety of alternative architectures and configurations. Additionally, although the disclosure is described above in terms of various examples and implementations, it should be understood that the various features and functionality described in one or more of the examples are not limited in their applicability to the particular example with which they are described. They instead can be applied alone or in some combination, to one or more of the other examples of the disclosure, whether or not such examples are described, whether or not such features are presented as being part of a described example. Thus, the breadth and scope of the present disclosure should not be limited by any of the above-described examples.

What is claimed is:

1. An electronic device, comprising:
a substrate; and
a system in package assembly comprising:
a plurality of components, the plurality of components including a first component including a first surface mounted to the substrate and a second surface, and
one or more thermal plugs including a first thermal plug mounted to the second surface of the first component, wherein a first surface of the first thermal plug directly contacts the second surface of the first component, and a second surface of the first thermal plug directly contacts a shielding layer,
the shielding layer dissipating and spreading heat by the first thermal plug to the substrate, wherein the shielding layer is electrically connected to ground.

2. The device of claim 1, wherein a size of the one or more thermal plugs is same as a size of the plurality of components.

3. The device of claim 1, wherein at least one of the one or more thermal plugs is electrically coupled to a ground or ground plane.

4. The device of claim 1, further comprising an insulating layer, the insulating layer coating sides of the plurality of components and the one or more thermal plugs.

5. The device of claim 4, further comprising a plurality of trenches formed in the insulating layer, wherein a width of each of the plurality of trenches is between 10-100 microns.

6. The device of claim 1, wherein the shielding layer and at least one of the one or more thermal plugs is electrically coupled.

7. The device of claim 1, wherein the shielding layer is electrically coupled to a ground or ground plane.

8. A method for forming an electronic device, comprising:
forming a substrate; and
forming a system in package assembly, comprising:
mounting a first surface of a plurality of components to the substrate, the plurality of components including a first component,
mounting one or more thermal plugs including mounting a first thermal plug to a second surface of first component, wherein a first surface of the first thermal plug directly contacts a second surface of the first component, and a second surface of the first thermal plug directly contacts a shielding layer,
forming the shielding layer, the shielding layer configured to dissipate and spread heat by first thermal plug to the substrate,
electrically connecting the shielding layer to ground.

9. The method of claim 8, further comprising:
forming an insulating layer, the insulating layer coating sides of the plurality of components and the one or more thermal plugs.

10. The method of claim 9, wherein the insulating layer is formed using at least one of a tape-assisted transfer molding process, lapping, polishing, and etching.

* * * * *